United States Patent
Kim et al.

(10) Patent No.: US 11,798,626 B2
(45) Date of Patent: *Oct. 24, 2023

(54) NONVOLATILE MEMORY DEVICE AND METHOD OF OPERATING A NONVOLATILE MEMORY

(71) Applicant: SAMSUNG ELECTRONICS CO., LTD., Suwon-si (KR)

(72) Inventors: Chaehoon Kim, Suwon-si (KR); Junyoung Ko, Hwaseong-si (KR); Sangwan Nam, Hwaseong-si (KR); Minjae Seo, Yongin-si (KR); Jiwon Seo, Seoul (KR); Hojun Lee, Uiwang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/947,320

(22) Filed: Sep. 19, 2022

(65) Prior Publication Data

US 2023/0018305 A1 Jan. 19, 2023

Related U.S. Application Data

(63) Continuation of application No. 17/234,175, filed on Apr. 19, 2021, now Pat. No. 11,475,956.

(30) Foreign Application Priority Data

Nov. 2, 2020 (KR) .................. 10-2020-0144152

(51) Int. Cl.
*G11C 16/34* (2006.01)
*G11C 16/08* (2006.01)
(Continued)

(52) U.S. Cl.
CPC .......... *G11C 16/08* (2013.01); *G11C 16/0425* (2013.01); *G11C 16/16* (2013.01);
(Continued)

(58) Field of Classification Search
CPC ..... G11C 16/08; G11C 16/0425; G11C 16/16; G11C 16/20; G11C 16/26; G11C 16/30; G11C 16/3404; G11C 2029/0411; G11C 2029/1202; G11C 2029/5006; G11C 8/08; G11C 16/0483; G11C 16/10;
(Continued)

(56) References Cited

U.S. PATENT DOCUMENTS 7,532,513 B2 5/2009 Chen et al.
8,159,883 B2 4/2012 Baek et al.
(Continued)

FOREIGN PATENT DOCUMENTS

DE 102022102589 A1 * 12/2022 ......... G11C 11/5628

*Primary Examiner* — Michael T Tran
(74) *Attorney, Agent, or Firm* — Sughrue Mion, PLLC

(57) ABSTRACT

A method of operating a nonvolatile memory device which includes at least one memory block is provided. The method includes providing a plurality of word-lines with a voltage during a word-line set-up period, precharging a plurality of driving lines with a voltage during a word-line development period, detecting a voltage drop of a sensing node during a sensing period, and detecting leakage based on the voltage drop.

20 Claims, 27 Drawing Sheets

(51) Int. Cl.
*G11C 16/20* (2006.01)
*G11C 16/16* (2006.01)
*G11C 16/04* (2006.01)
*G11C 16/30* (2006.01)
*G11C 16/26* (2006.01)

(52) U.S. Cl.
CPC .............. *G11C 16/20* (2013.01); *G11C 16/26* (2013.01); *G11C 16/30* (2013.01); *G11C 16/3404* (2013.01)

(58) Field of Classification Search
CPC . G11C 16/3445; G11C 16/3459; G11C 16/32; G11C 29/025; H01L 27/115
USPC ........................................ 365/185.13, 185.24
See application file for complete search history.

(56) References Cited

U.S. PATENT DOCUMENTS

| | | | |
|---|---|---|---|
| 8,432,732 B2 | 4/2013 | Li et al. | |
| 8,514,630 B2 | 8/2013 | Huynh et al. | |
| 8,891,300 B2* | 11/2014 | Oh | G11C 16/0483 365/185.24 |
| 8,934,305 B2* | 1/2015 | Park | G11C 11/5628 365/185.24 |
| 8,942,048 B2* | 1/2015 | Lee | G11C 16/3427 365/185.24 |
| 8,964,467 B1* | 2/2015 | Dusija | G11C 16/0483 365/185.24 |
| 8,964,480 B2* | 2/2015 | Mui | G11C 16/26 365/185.23 |
| 8,971,115 B2* | 3/2015 | Hosono | G11C 16/0483 365/185.11 |
| 8,976,603 B2* | 3/2015 | Iwai | G11C 16/0483 365/185.24 |
| 9,318,209 B1 | 4/2016 | Huynk et al. | |
| 10,008,276 B2 | 6/2018 | Huynh et al. | |
| 10,734,077 B1 | 8/2020 | Kamae et al. | |
| 10,762,973 B1 | 9/2020 | Lu et al. | |
| 11,024,392 B1 | 6/2021 | Chen et al. | |
| 11,508,440 B1* | 11/2022 | Zhao | G11C 16/0483 |
| 2009/0016110 A1 | 1/2009 | Choi et al. | |
| 2009/0180330 A1 | 7/2009 | VanBuskirk et al. | |
| 2011/0063916 A1 | 3/2011 | Maeda | |
| 2011/0067460 A1 | 3/2011 | Niwa et al. | |
| 2013/0272067 A1 | 10/2013 | Lee et al. | |
| 2013/0294166 A1 | 11/2013 | Ha | |
| 2014/0233323 A1* | 8/2014 | Iwai | G11C 16/14 365/185.29 |
| 2015/0003157 A1 | 1/2015 | Aritome | |
| 2015/0063037 A1* | 3/2015 | Lee | G11C 16/0483 365/185.24 |
| 2015/0178000 A1 | 6/2015 | Yoon et al. | |
| 2015/0228347 A1* | 8/2015 | Itagaki | G11C 16/0483 365/185.17 |
| 2016/0064083 A1 | 3/2016 | Nam et al. | |
| 2016/0086671 A1 | 3/2016 | Lee et al. | |
| 2017/0140828 A1 | 5/2017 | Jung et al. | |
| 2019/0006021 A1 | 1/2019 | Ghai et al. | |
| 2019/0146040 A1 | 5/2019 | Murakami et al. | |
| 2019/0385658 A1 | 12/2019 | Lee | |
| 2020/0105345 A1 | 4/2020 | Baek et al. | |
| 2020/0143883 A1 | 5/2020 | Joo et al. | |
| 2020/0143890 A1 | 5/2020 | Lee | |
| 2020/0210369 A1 | 7/2020 | Song | |
| 2020/0388630 A1 | 12/2020 | Yun et al. | |
| 2020/0394106 A1 | 12/2020 | Kang et al. | |
| 2021/0202517 A1 | 7/2021 | Lin et al. | |
| 2021/0327510 A1 | 10/2021 | Song | |
| 2021/0335431 A1 | 10/2021 | Choi et al. | |
| 2023/0015493 A1* | 1/2023 | Jung | G11C 16/24 |
| 2023/0022531 A1* | 1/2023 | Hsu | G11C 16/24 |

\* cited by examiner

NONVOLATILE MEMORY DEVICE AND METHOD OF OPERATING A NONVOLATILE MEMORY

CROSS-REFERENCE TO RELATED APPLICATION

This is a Continuation of U.S. application Ser. No. 17/234,175 filed Apr. 19, 2021, now U.S. Pat. No. 11,475,956, issued Oct. 18, 2022, which claims priority from Korean Patent Application No. 10-2020-0144152, filed on Nov. 2, 2020 in the Korean Intellectual Property Office, the disclosures of which are incorporated herein by reference in their entireties.

BACKGROUND

1. Technical Field

Methods, apparatuses and systems consistent with example embodiments relate to semiconductor memory devices, and more particularly to a nonvolatile memory device and a method of operating a nonvolatile memory device.

2. Related Art

Semiconductor memory devices for storing data include volatile memory devices and nonvolatile memory devices. Volatile memory devices, such as dynamic random access memory (DRAM) devices, are typically configured to store data by charging or discharging capacitors in memory cells, and lose the stored data when power is off. Nonvolatile memory devices, such as flash memory devices, may maintain stored data even when power is off. Volatile memory devices are widely used as main memories of various apparatuses, while nonvolatile memory devices are widely used for storing program codes and/or data in various electronic devices, such as computers, mobile devices, etc.

Recently, nonvolatile memory devices of three-dimensional structure such as a vertical NAND memory devices have been developed to increase integration degree and memory capacity of the nonvolatile memory devices. Along with increases in the integration degree and memory capacity, leakage current may occur in word-lines of the nonvolatile memory device, and user operation such as program operation, read operation and erase operation may operate abnormally.

SUMMARY

Some example embodiments provide a nonvolatile memory device capable of simultaneously detecting word-lines in which leakage occurs.

Some example embodiments provide a method of operating a nonvolatile memory device, capable of simultaneously detecting word-lines in which leakage occurs.

According to example embodiments, a method of operating a nonvolatile memory device is provided. The nonvolatile memory device includes at least one memory block including a plurality of cell strings, each of which includes a string selection transistor, a plurality of memory cells and a ground selection transistor which are connected in series and arranged in a vertical direction between a bit-line and a source line. The method includes: during a word-line set-up period and while applying a first voltage to a block word-line that is coupled to each gate of a plurality of pass transistors which respectively connect a string selection line, a plurality of word-lines and a ground selection line to a plurality of driving lines, applying a second voltage to the plurality of driving lines, commonly coupled to a sensing node, to provide the plurality of word-lines with a third voltage, the string selection line being coupled to the string selection transistor, the plurality of word-lines being coupled to the plurality of memory cells and the ground selection line being coupled to the ground selection transistor; during a word-line development period and while precharging the plurality of driving lines with the second voltage, applying a fourth voltage to the block word-line to turn-off the plurality of pass transistors to develop target word-lines from among the plurality of word-lines; and during a sensing period, applying a fifth voltage smaller than the first voltage to the block word-line, detecting a voltage drop of the sensing node, and detecting leakage of the target word-lines based on the voltage drop.

According to example embodiments, a nonvolatile memory device includes at least one memory block including a plurality of cell strings where each of the plurality of cell strings, each of which includes a string selection transistor, a plurality of memory cells and a ground selection transistor which are connected in series and arranged in a vertical direction between a bit-line and a source line; and a control circuit configured to control a leakage detection operation by: during a word-line set-up period and while applying a first voltage to a block word-line that is coupled to each gate of a plurality of pass transistors which respectively connect a string selection line, a plurality of word-lines and a ground selection line to a plurality of driving lines, applying a second voltage to the plurality of driving lines, commonly coupled to a sensing node, to provide the plurality of word-lines with a third voltage, the string selection line being coupled to the string selection transistor, the plurality of word-lines being coupled to the plurality of memory cells and the ground selection line being coupled to the ground selection transistor; during a word-line development period and while precharging the plurality of driving lines with the second voltage, applying a fourth voltage to the block word-line to turn-off the plurality of pass transistors to develop target word-lines from among the plurality of word-lines; and during a sensing period, applying a fifth voltage smaller than the first voltage to the block word-line, detecting a voltage drop of the sensing node, and detecting leakage of the target word-lines based on the voltage drop.

According to example embodiments, a nonvolatile memory device includes at least one memory block including a plurality of cell strings, each of which includes a string selection transistor, a plurality of memory cells and a ground selection transistor which are connected in series and arranged in a vertical direction between a bit-line and a source line; a voltage generator configured to generate word-line voltages based on a control signal; an address decoder configured to provide the word-line voltages to the at least one memory block; a leakage detector coupled to the address decoder at a sensing node; and a control circuit configured to control the voltage generator, the address decoder and the leakage detector. The control circuit is configured to control a leakage detection operation by: during a word-line set-up period and while applying a first voltage to a block word-line that is coupled to each gate of a plurality of pass transistors which respectively connect a string selection line, a plurality of word-lines and a ground selection line to respective one of a plurality of driving lines, applying a second voltage to the plurality of driving lines, commonly coupled to the sensing node, to provide the plurality of word-lines with a third voltage, the string selection line being coupled to the string selection transistor, the plurality of word-lines coupled to the plurality of memory cells and the ground selection line coupled to the ground selection transistor; during a word-line development period and while precharging the plurality of driving lines with the second voltage, applying a fourth voltage to the block word-line to turn-off the plurality of pass transistors to develop target word-lines from among the plurality of word-lines; and during a sensing period, applying a fifth voltage smaller than the first voltage to the block word-line, detecting a voltage drop of the sensing node, and detecting leakage of the target word-lines based on the voltage drop. The control circuit is configured to perform the leakage detection operation during a program operation of a program loop on the at least one memory block, and the control circuit is configured to end the program loop on the at least one memory block based on the leakage occurring in at least one of the plurality of word-lines.

The nonvolatile memory device and the method of operating the nonvolatile memory device may rapidly detect leakage of at least a portion of word-lines by precharging driving lines coupled to the word-lines through pass transistors, applying a voltage lower than a turn-on voltage to the pass transistors and detecting a voltage drop of a sensing node commonly coupled to the driving lines.

BRIEF DESCRIPTION OF THE DRAWINGS

Illustrative, non-limiting example embodiments will be more clearly understood from the following detailed description in conjunction with the accompanying drawings in which.

DETAILED DESCRIPTION

Example embodiments will be described more fully hereinafter with reference to the accompanying drawings.

Figure 1:
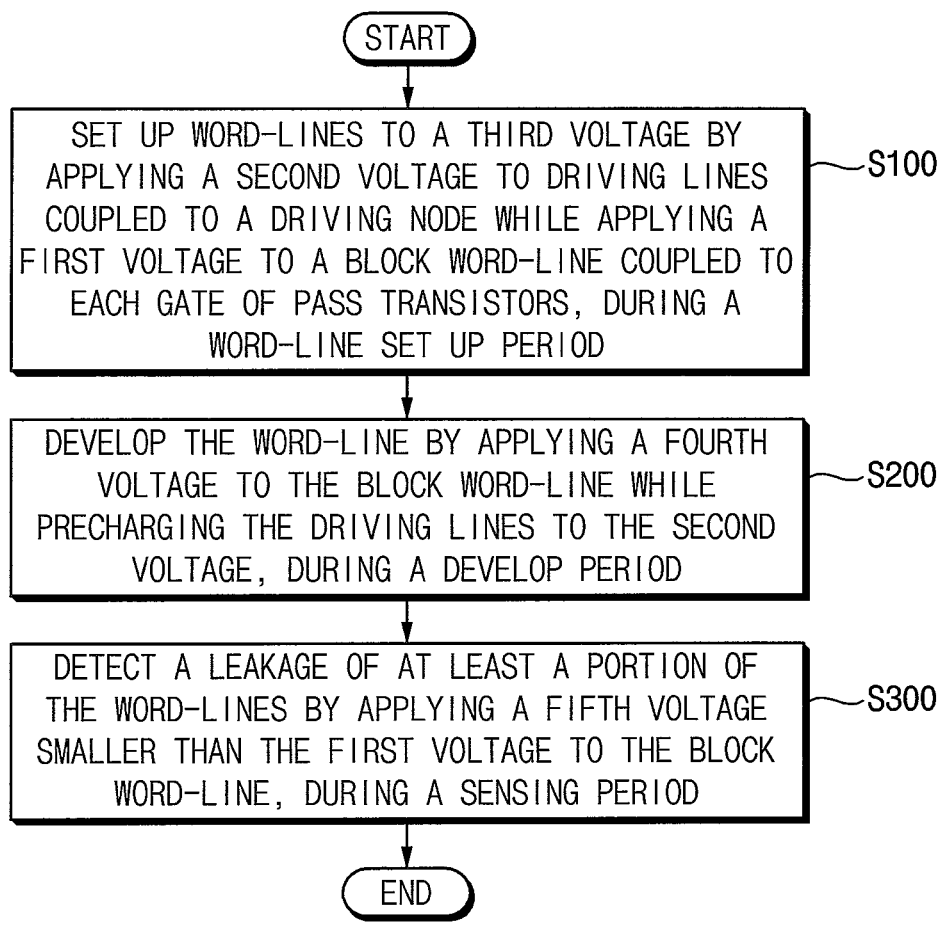
FIG. 1 is a flow chart illustrating a method of operating a nonvolatile memory device according to example embodiments.

FIG. 1 is a flow chart illustrating a method of operating a nonvolatile memory device according to example embodiments.

FIG. 1 illustrates a method of operating a nonvolatile memory device including at least one memory block which includes a plurality of cell strings, where each cell string includes a string selection transistor, a plurality of memory cells and a ground selection transistor connected between a bit-line and a source line. According to example embodiments, the nonvolatile memory device may include a three-dimensional NAND flash memory device or a vertical NAND flash memory device.

Referring to FIG. 1, during a word-line set-up period, while applying a first voltage to a block word-line coupled to each gate of a plurality of pass transistors which connect a string selection line, a plurality of word-lines and a ground selection line to respective one of a plurality of driving lines, a second voltage is applied to the plurality of driving lines, commonly coupled to a sensing node, to set-up the plurality of word-lines with a third voltage, where the string selection line is coupled to the string selection transistor, the plurality of word-lines are coupled to the memory cells and the ground selection line is coupled to the ground selection transistor (operation S100).

During a word-line development period, while precharging the plurality of driving lines with the second voltage, target word-lines from among the plurality of word-lines are developed by applying a fourth voltage to the block word-line to turn-off the plurality of pass transistors (operation S200). The fourth voltage may correspond to a ground voltage.

During a sensing period, leakage of at least a portion of the target word-lines is detected by applying a fifth voltage smaller than the first voltage to the block word-line and by detecting a voltage drop of the sensing node (operation S300).

Figure 2:
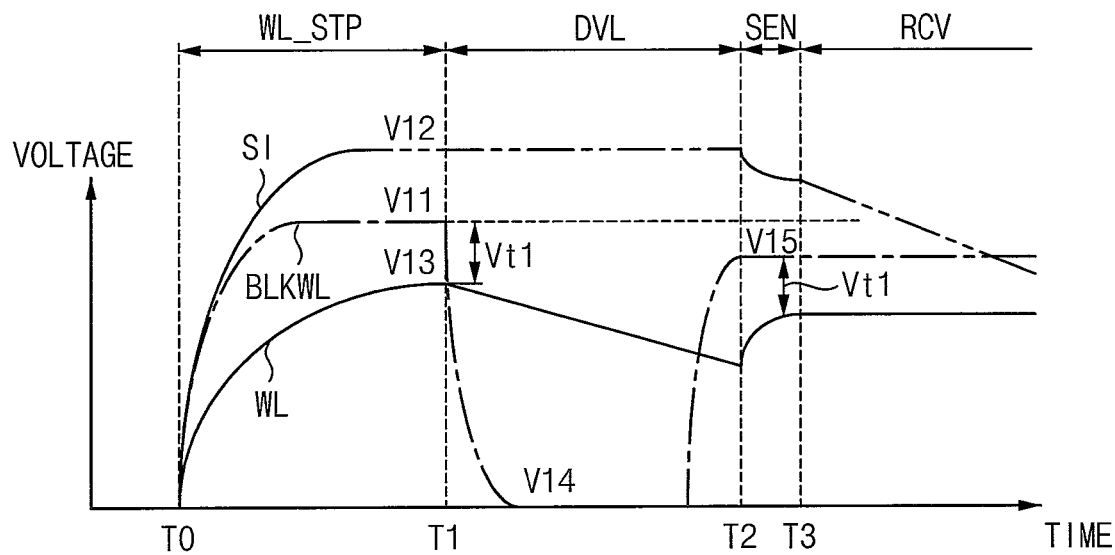
FIGS. 2, 3 and 4 are timing diagrams illustrating a method of operating a nonvolatile memory device according to example embodiments, respectively.
Figure 3:
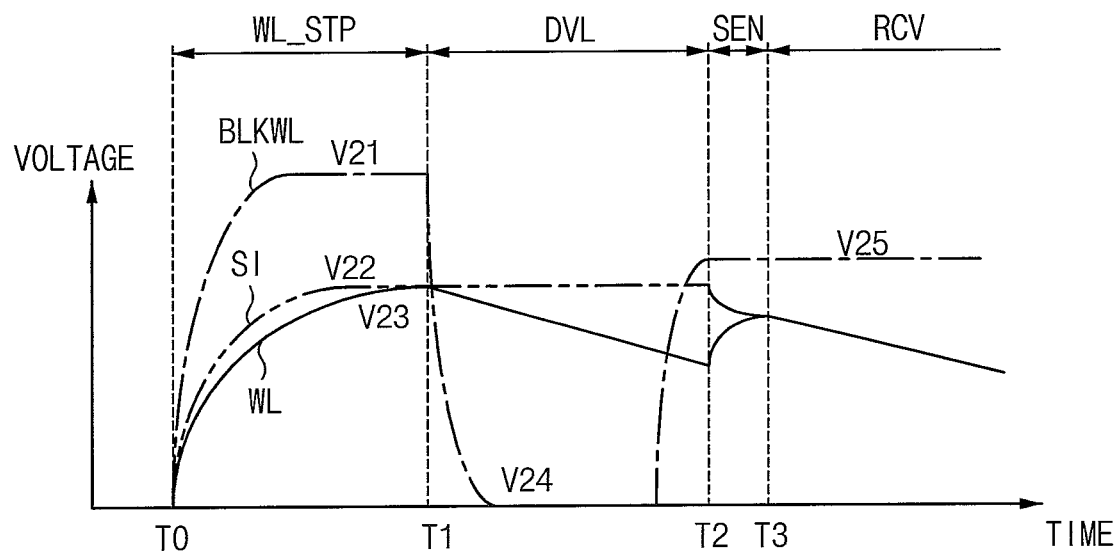
Figure 4:
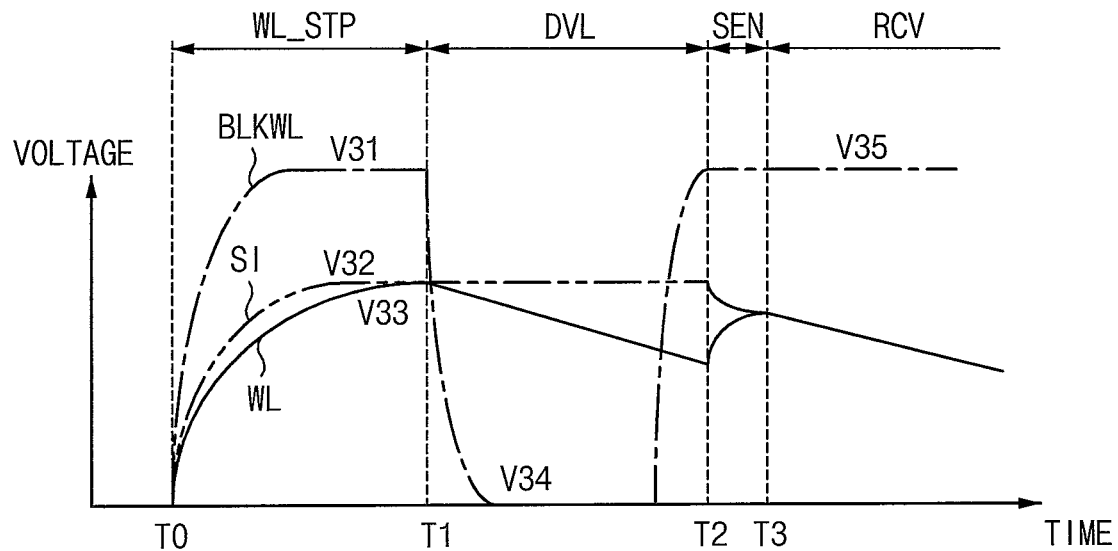

FIGS. 2, 3 and 4 are timing diagrams illustrating a method of operating a nonvolatile memory device according to example embodiments, respectively.

Each of FIGS. 2, 3 and 4 illustrates a word-line set-up period WL_STP, a word-line development period DVL, a sensing period SEN and a recovery period RCV of a leakage detection operation for detecting leakage of a plurality of word-lines. Time points T0~T4 represents boundaries of the periods.

Referring to FIG. 2, during the word-line set-up period WL_STP, a first voltage V11 is applied to a block word-line BLKWL, and a second voltage V12 is applied to driving lines SI. A level of the second voltage V12 may be greater than a level of the first voltage V11. When the pass transistors are turned-on (enabled) in response to the first voltage V11 applied to the block word-line BLKWL, voltages of word-lines WL coupled to the driving lines SI through the pass transistors increase from a ground voltage to a level of a third voltage V13 and the word-lines WL are set-up with the third voltage V13. When a level of the third voltage V13 becomes smaller than the level of the first voltage V11 by a first threshold voltage Vt1, the pass transistors may be turned-off.

During the word-line development period DVL, while precharging the driving lines SI with the second voltage V12, a fourth voltage V14 corresponding to the ground voltage is applied to the pass transistors to turn-off the pass transistors. Since the pass transistors are turned-off, voltages of target word-lines selected from the word-lines WL decrease from the third voltage V13 and the target word-lines are developed.

During the sensing period SEN, leakage of at least a portion of the target word-lines is detected (determined) by applying a fifth voltage V15 smaller than the first voltage V11 to the block word-line BLKWL and by detecting a voltage drop of the sensing node. A level of the fifth voltage V15 may be greater than the first voltage V11 by the first threshold voltage Vt1.

Since at least one pass transistor coupled to at least one word-line in which leakage occurs is turned-on by the fifth voltage V15, charge sharing occurs between a driving line coupled to the at least one pass transistor and the at least one word-line in which leakage occurs and a voltage level of the driving line coupled to the at least one word-line in which leakage occurs decreases. Therefore, a voltage drop occurs at the sensing node.

If leakage does not occur in any of the target word-lines, none of the pass transistors are turned-on by the fifth voltage V15 and the voltage drop does not occur at the sensing node.

During the recovery period RCV, the voltage level of the driving line coupled to the at least one word-line in which leakage occurs continues to decrease.

Referring to FIG. 3, during the word-line set-up period WL_STP, a first voltage V21 is applied to the block word-line BLKWL, and a second voltage V22 is applied to the driving lines SI. A level of the first voltage V21 may be greater than a level of the second voltage V22. When the pass transistors are turned-on (enabled) in response to the first voltage V21 applied to the block word-line BLKWL, voltage of the word-lines WL coupled to the driving lines SI through the pass transistors increases from the ground voltage to a level of a third voltage V23 and the word-lines WL are set-up with the third voltage V23. A level of the third voltage V23 becomes substantially the same as the second voltage V22.

During the word-line development period DVL, while precharging the driving lines SI with the second voltage V22, a fourth voltage V24 corresponding to the ground voltage is applied to the pass transistors to turn-off the pass transistors. Since the pass transistors are turned-off, voltages of target word-lines selected from the word-lines WL decrease from the third voltage V23 and the target word-lines are developed.

During the sensing period SEN, leakage of at least a portion of the target word-lines is detected (determined) by applying a fifth voltage V25 smaller than the first voltage V21 to the block word-line BLKWL and by detecting a voltage drop of the sensing node. A level of the fifth voltage V25 may be greater than the first voltage V21 by the first threshold voltage.

Since at least one pass transistor coupled to at least one word-line in which leakage occurs is turned-on by the fifth voltage V25, a charge sharing occurs between a driving line coupled to the at least one pass transistor and the at least one word-line in which leakage occurs and a voltage level of the driving line coupled to the at least one word-line in which leakage occurs decreases. Therefore, a voltage drop occurs at the sensing node.

If leakage does not occur in any of the target word-lines, none of the pass transistors are turned-on by the fifth voltage V15 and the voltage drop does not occur at the sensing node.

During the recovery period RCV, the voltage levels the at least one word-line in which leakage occurs and the driving line coupled to the at least one word-line in which leakage occurs is continuously decreased.

Referring to FIG. 4, during the word-line set-up period WL_STP, a first voltage V31 is applied to the block word-line BLKWL, and a second voltage V32 is applied to the driving lines SI. A level of the first voltage V31 may be greater than a level of the second voltage V32. When the pass transistors are turned-on (enabled) in response to the first voltage V31 applied to the block word-line BLKWL, voltage of the word-lines WL coupled to the driving lines SI through the pass transistors increases from the ground voltage to a level of a third voltage V33 and the word-lines WL are set-up with the third voltage V33. A level of the third voltage V33 becomes substantially the same as the second voltage V32.

During the word-line development period DVL, while precharging the driving lines SI with the second voltage V32, a fourth voltage V34 corresponding to the ground voltage is applied to the pass transistors to turn-off the pass transistors. Since the pass transistors are turned-off, voltages of target word-lines selected from the word-lines WL decrease from the third voltage V33 and the target word-lines are developed.

During the sensing period SEN, leakage of at least a portion of the target word-lines is detected (determined) by applying a fifth voltage V35 having a level which is substantially the same as the level of the first voltage V31 to the block word-line BLKWL and by detecting a voltage drop of the sensing node.

Since at least one pass transistor coupled to at least one word-line in which leakage occurs is turned-on by the fifth voltage V35, charge sharing occurs between a driving line coupled to the at least one pass transistor and the at least one word-line in which leakage occurs and a voltage level of the driving line coupled to the at least one word-line in which leakage occurs decreases. Therefore, a voltage drop occurs at the sensing node.

During the recovery period RCV, the voltage levels the at least one word-line in which leakage occurs and the driving line coupled to the at least one word-line in which leakage occurs continues to decrease.

Figure 5:
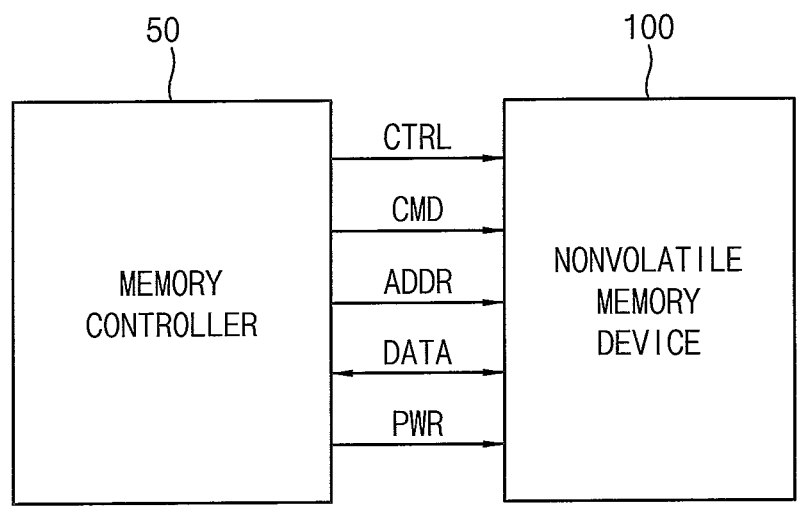
FIG. 5 is a block diagram illustrating a memory system the according to example embodiments.

FIG. 5 is a block diagram illustrating a memory system (i.e., a storage device) the according to example embodiments.

Referring to FIG. 5, a storage device (i.e., a memory system) 10 may include a memory controller 50 and at least one nonvolatile memory device 100.

In example embodiments, each of the memory controller 50 and the nonvolatile memory device 100 may be provided in the form of a chip, a package, or a module. Alternatively, the memory controller 50 and the nonvolatile memory device 100 may be packaged into one of various packages.

The nonvolatile memory device 100 may perform an erase operation, a program operation or a write operation under control of the memory controller 50. The nonvolatile memory device 100 receives a command CMD, an address ADDR and data DATA through input/output lines from the memory controller 50 for performing such operations. In addition, the nonvolatile memory device 100 receives a control signal CTRL through a control line from the memory controller 50. In addition, the nonvolatile memory device 100 receives a power PWR through a power line from the memory controller 50.

Figure 6:
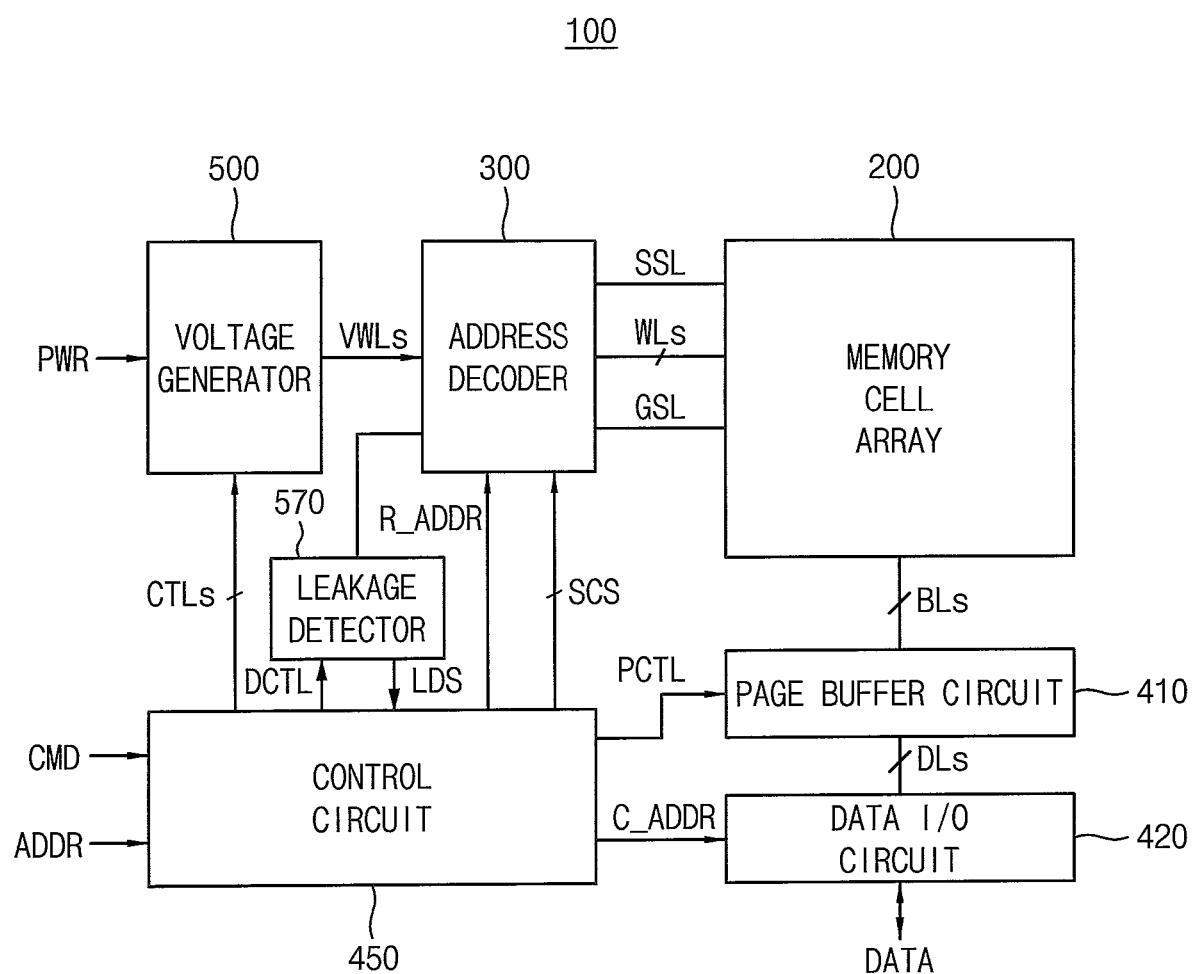
FIG. 6 is a block diagram illustrating the nonvolatile memory device in the memory system of FIG. 5 according to example embodiments.

FIG. 6 is a block diagram illustrating the nonvolatile memory device in the memory system of FIG. 5 according to example embodiments.

Referring to FIG. 6, the nonvolatile memory device 100 includes a memory cell array 200, an address decoder 300, a page buffer circuit 410, a data input/output (I/O) circuit 420, a control circuit 450, a voltage generator 500 and a leakage detector 570.

The memory cell array 200 may be coupled to the address decoder 300 through a string selection line SSL, a plurality of word-lines WLs, and a ground selection line GSL. In addition, the memory cell array 200 may be coupled to the page buffer circuit 410 through a plurality of bit-lines BLs. The memory cell array 200 may include a plurality of memory cells coupled to the plurality of word-lines WLs and the plurality of bit-lines BLs.

In some example embodiments, the memory cell array 200 may be a three-dimensional memory cell array, which is formed on a substrate in a three-dimensional structure (or a vertical structure). In this case, the memory cell array 200 may include vertical cell strings that are vertically oriented such that at least one memory cell is located over another memory cell.

The control circuit 450 may receive a command (signal) CMD and an address (signal) ADDR from the memory controller 50 and control a user operation and a leakage detection operation of the nonvolatile memory device 100 based on the command signal CMD and the address signal ADDR. The user operation may include an erase loop, a program loop and a read operation of the nonvolatile memory device 100. The program loop may include a program operation and a program verification operation. The erase loop may include an erase operation and an erase verification operation.

For example, the control circuit 450 may generate control signals CTLs to control the voltage generator 500, may generate a page buffer control signal PCTL to control the page buffer circuit 410 and may generate a control signal DCTL to control the leakage detector 570 based on the command signal CMD. The control circuit 450 may generate a row address R_ADDR and a column address C_ADDR based on the address signal ADDR. The control circuit 450 may provide the row address R_ADDR to the address decoder 300 and provide the column address C_ADDR to the data input/output circuit 420. In addition, the control circuit 450 may generate switching control signals SCS based on the command signal CMD and may provide the switching control signals SCS to the address decoder 300.

The address decoder 300 may be coupled to the memory cell array 200 through the string selection line SSL, the plurality of word-lines WLs, and the ground selection line GSL. During the program operation or the read operation, the address decoder 300 may determine one of the plurality of word-lines WLs as a selected word-line and determine the rest of the plurality of word-lines WLs, except for the selected word-line, as unselected word-lines based on the row address R_ADDR.

The voltage generator 500 may generate word-line voltages VWLs, which are required for the operation of the nonvolatile memory device 100, based on the control signals CTLs. The voltage generator 500 may receive the power PWR from the memory controller 50. The word-line voltages VWLs may be applied to the plurality of word-lines WLs through the address decoder 300.

For example, during the erase operation, the voltage generator 500 may apply an erase voltage to a well of the memory block and may apply a ground voltage to each of the word-lines of the memory block. During the erase verification operation, the voltage generator 500 may apply an erase verification voltage to each of the word-lines of the memory block or sequentially apply the erase verification voltage to word-lines in a word-line basis.

For example, during the program operation, the voltage generator 500 may apply a program voltage to the selected word-line and may apply a program pass voltage to the unselected word-lines. In addition, during the program verification operation, the voltage generator 500 may apply a program verification voltage to the selected word-line and may apply a verification pass voltage to the unselected word-lines.

The page buffer circuit 410 may be coupled to the memory cell array 200 through the plurality of bit-lines BLs. The page buffer circuit 410 may include a plurality of page buffers. The page buffer circuit 410 may temporarily store data to be programmed in a selected page or data read out from the selected page.

The data input/output circuit 420 may be coupled to the page buffer circuit 410. During the program operation, the data input/output circuit 420 may receive program data DATA from the memory controller 50 and provide the program data DATA to the page buffer circuit 410 based on the column address C_ADDR received from the control circuit 450. During the read operation, the data input/output circuit 420 may provide read data DATA, which are stored in the page buffer circuit 410, to the memory controller 50 based on the column address C_ADDR received from the control circuit 450.

The leakage detector 570 may be coupled to the address decoder 300, may be coupled to driving lines coupled to the word-lines WLs at a sensing node in the address decoder 300 to detect leakage of at least a portion of the word-lines WLs and may provide the control circuit 450 with a leakage detection signal LDS when the leakage is detected.

Figure 7:
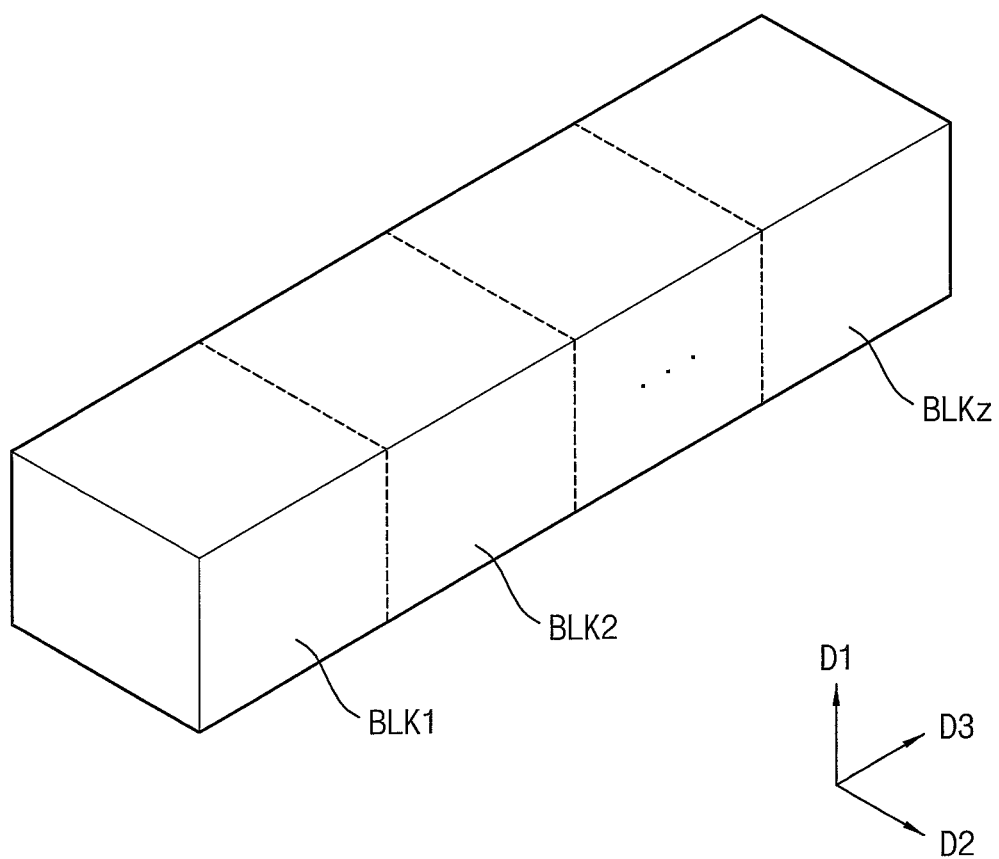
FIG. 7 is a block diagram illustrating an example of the memory cell array in FIG. 6 according to example embodiments.

FIG. 7 is a block diagram illustrating an example of the memory cell array in FIG. 6 according to example embodiments.

Referring to FIG. 7, the memory cell array 200 may include a plurality of memory blocks BLK1 to BLKz which extend along first through third directions D1, D2 and D3. In an example embodiment, the memory blocks BLK1 to BLKz are selected by the address decoder 300 in FIG. 6. For example, the address decoder 300 may select a memory block BLK corresponding to a block address among the memory blocks BLK1 to BLKz.

Hereinafter, the first direction D1 indicates a direction perpendicular to an upper surface of a semiconductor substrate, and the second direction D2 and the third direction D3 indicate two directions parallel to the upper surface of the semiconductor substrate. For example, the second direction and the third direction D3 may be perpendicular to each other. The first direction D1 may be referred to as a vertical direction, the second direction D2 may be referred to as a row direction and the third direction D3 may be referred to as a column direction. The direction indicated by an arrow in figures and the opposite direction may be considered as the same direction.

Figure 8:
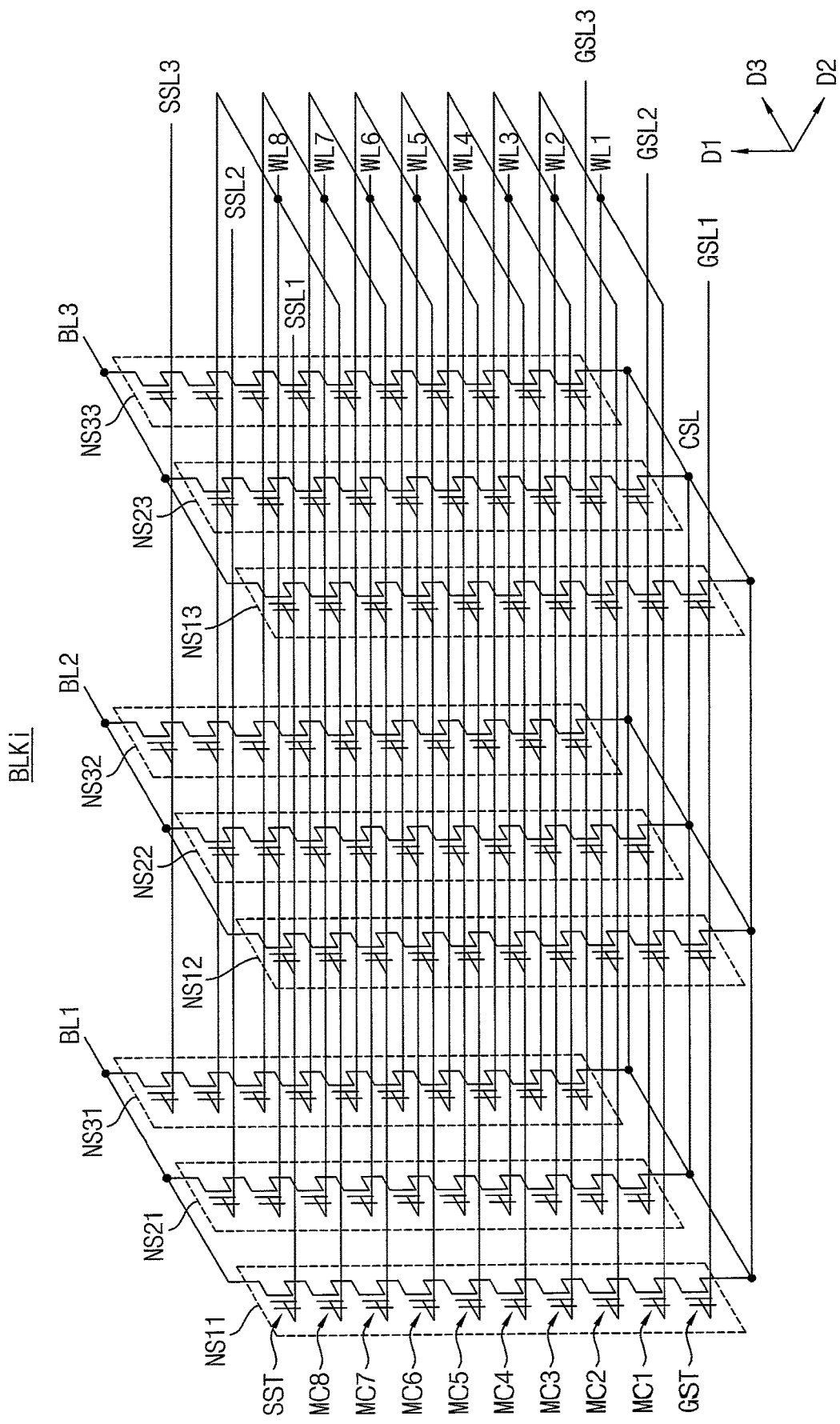
FIG. 8 is a circuit diagram illustrating one of the memory blocks in FIG. 7 according to example embodiments.

FIG. 8 is a circuit diagram illustrating one of the memory blocks in FIG. 7 according to example embodiments.

The memory block BLKi of FIG. 8 may be formed on a substrate in a three-dimensional structure (or a vertical structure). For example, a plurality of memory cell strings included in the memory block BLKi may be formed in a direction perpendicular to the substrate.

Referring to FIG. 8, the memory block BLKi may include memory cell strings NS11 to NS33 coupled between bit-lines BL1, BL2 and BL3 and a common source line CSL.

Each of the memory cell strings NS11 to NS33 may include a string selection transistor SST, a plurality of memory cells MC1 to MC8, and a ground selection transistor GST. In FIG. 6A, each of the memory cell strings NS11 to NS33 is illustrated to include eight memory cells MC1 to MC8. However, example embodiments are not limited thereto. In some example embodiments, each of the memory cell strings NS11 to NS33 may include any number of memory cells. For example, each of the memory cell strings NS11 to NS33 may include more than eight memory cells or fewer than eight memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL. Word-lines (e.g., WL1) having the same height may be commonly connected, and the ground selection lines GSL1 to GSL3 and the string selection lines SSL1 to SSL3 may be separated.

Figure 9:
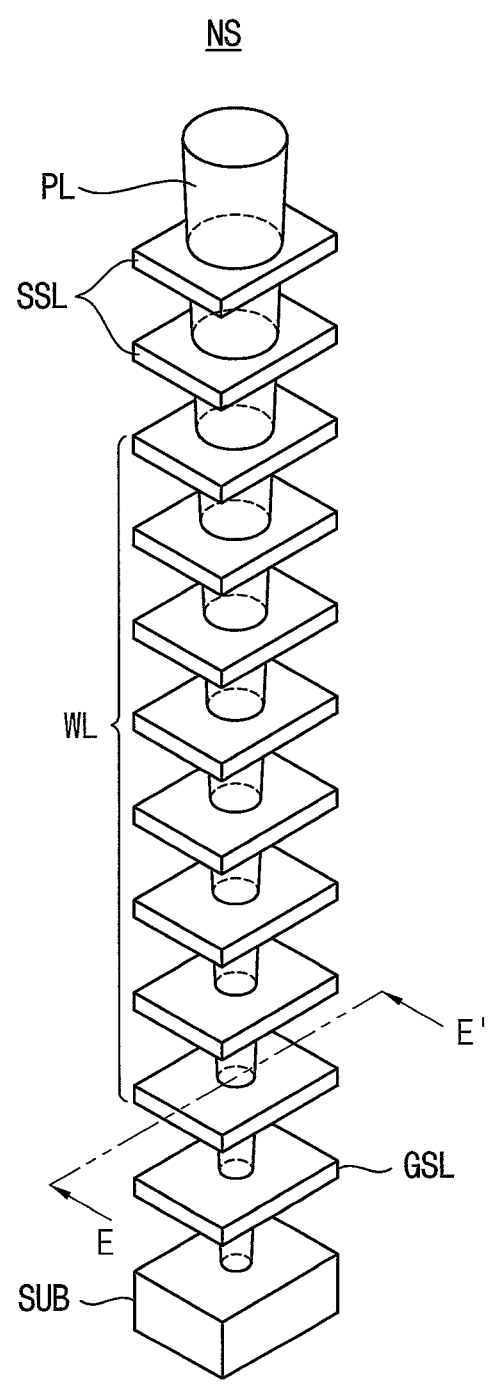
FIG. 9 is a diagram illustrating an example structure of a cell string.
Figure 10:
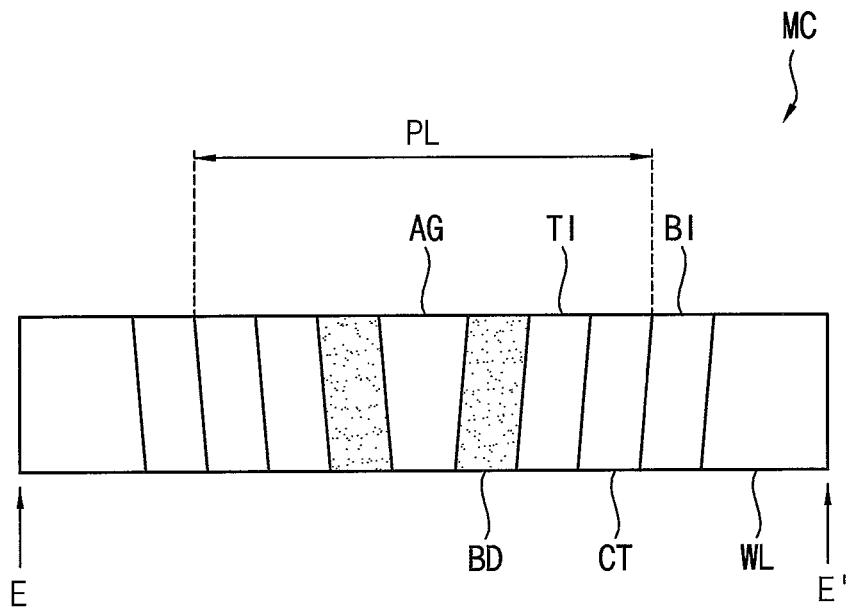
FIG. 10 is a diagram illustrating a memory cell included in the cell string of FIG. 9.

FIG. 9 is a diagram illustrating an example structure of a cell string, and FIG. 10 is a diagram illustrating a memory cell included in the cell string of FIG. 9.

Referring to FIGS. 9 and 10, a pillar PL extending in a vertical direction may be formed on a substrates SUB for providing the cell string NS. The ground selection line GSL, the word-lines WL and the string selection lines SSL may be formed of conductive materials, such as metals, which are parallel to the substrate SUB. The pillar PL may penetrate the conductive materials forming ground selection line GSL, the word-lines WL and the string selection lines SSL to contact the substrate SUB. The word-lines WL may include dummy word-lines.

FIG. 10 illustrates a cross-sectional view cut along the line E-E' in FIG. 9. As an example, a cross-section of one memory cell MC corresponding to a word-line is illustrated in FIG. 10. The pillar PL may include a body BD in a form of a cylinder, and an airgap AG may be provided in the body BD. The body BD may include silicon of a P-type and the body BD may be a region in which a channel if formed.

The pillar PL may further include a tunnel insulation layer TI surrounding the body BD and a charge capturing layer CT surrounding the tunnel insulation layer T1. A blocking insulation layer BI may be provided between one word-line and the pillar PL. The body BD, the tunnel insulation layer TI, the charge capturing layer CT, the blocking insulation layer BI and the one word-line may form a transistor of a charge capturing type. In some example embodiments, the string selection transistor SST, the ground selection transistor GST and the other memory cells may have the same structure as illustrated in FIG. 10.

As illustrated in FIGS. 9 and 10, the width or the cross-section area of the pillar PL may decrease as the distance to the substrate SUB decreases.

When the same voltage is applied to the bodies of the ground selection transistor GST, the memory cells MC and the string selection transistor SST, and the same voltage is applied to the ground selection line GLS, the word-lines WL and the string selection line SSL, the electric field formed in the memory cell located near the substrate SUB is greater than the electric field formed in the memory cell located far from the substrate SUB. These characteristics affect the program disturbance during the program operation.

Figure 11:
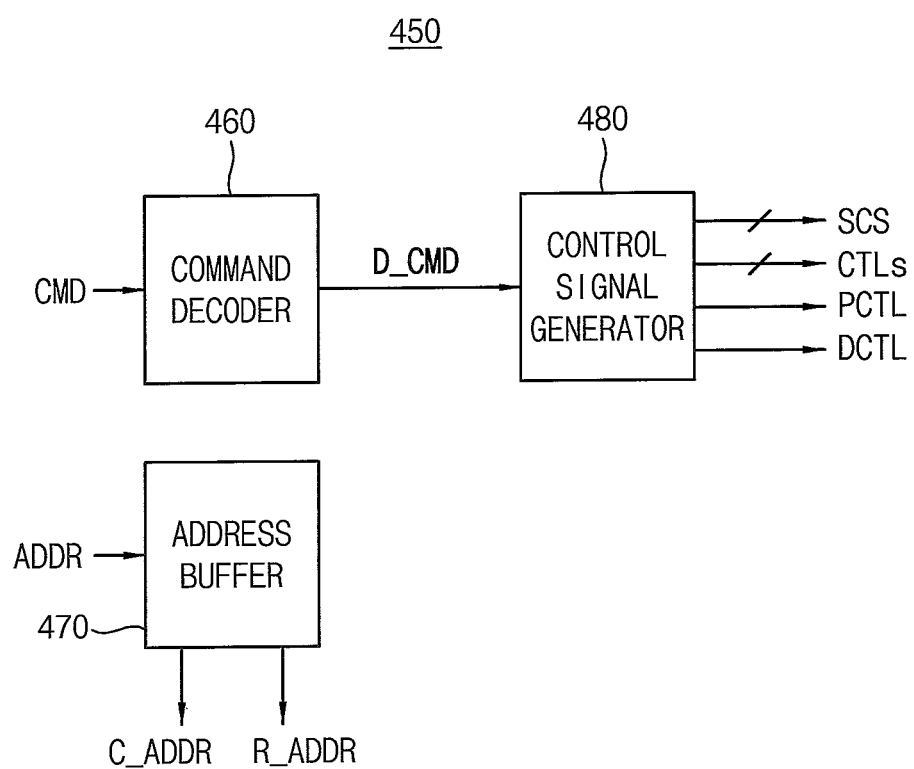
FIG. 11 is a block diagram illustrating the control circuit in the nonvolatile memory device of FIG. 6 according to example embodiments.

FIG. 11 is a block diagram illustrating the control circuit in the nonvolatile memory device of FIG. 6 according to example embodiments.

Referring to FIG. 11, the control circuit 450 includes a command decoder 460, an address buffer 470 and a control signal generator 480.

The command decoder 460 decodes the command CMD and provides a decoded command D_CMD to the control signal generator 480.

The address buffer 470 receives the address signal ADDR, provides the row address R_ADDR to the address decoder 300 and provides the column address C_ADDR to the data input/output circuit 420.

The control signal generator 480 receives the decoded command D_CMD, generates the control signals CTLs based on an operation directed by the decoded command D_CMD, provides the control signals CTLs to the voltage generator 500, generates a page buffer control signal PCTL, provides the page buffer control signal PCTL to the page buffer circuit 410, generates the control signal DCTL and provides the control signal DCTL to the leakage detector 570. In addition, the control signal generator 480 generates the switching control signals SCS based on the decoded command D_CMD and provides the switching control signals SCS to the address decoder 300.

Figure 12:
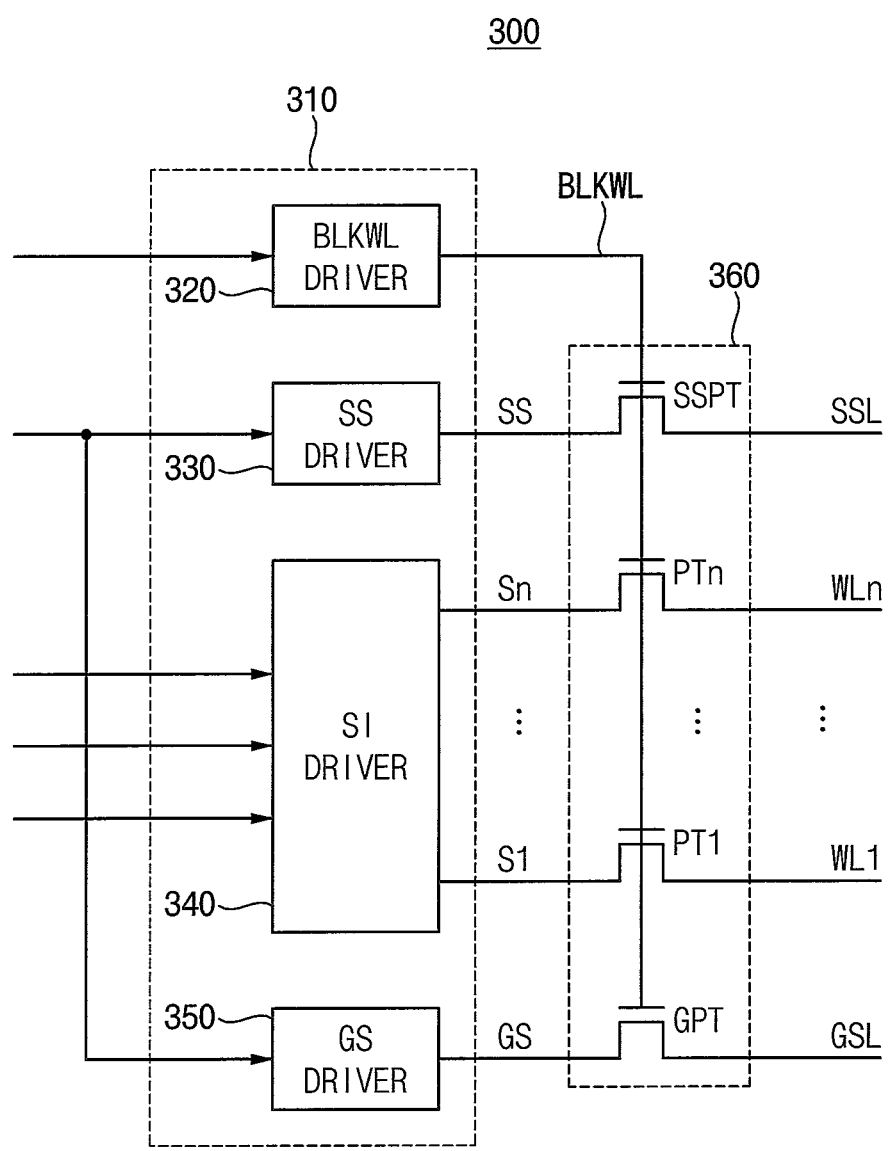
FIG. 12 is a block diagram illustrating an example of the address decoder in the nonvolatile memory device of FIG. 6 according to example embodiments.

FIG. 12 is a block diagram illustrating an example of the address decoder in the nonvolatile memory device of FIG. 6 according to example embodiments.

Referring to FIG. 12, the address decoder 300 may include a driver circuit 310 and a pass switch circuit 360.

The driver circuit 310 may transfer voltages provided from the voltage generator 500 to the memory cell array 200 in response to a block address. The driver circuit 310 may include a block selection driver BWLWL DRIVER 320, a string selection driver SS DRIVER 330, a driving line driver SI DRIVER 340 and a ground selection driver GS DRIVER 350.

The block selection driver 320 may supply a high voltage from the voltage generator 500 to the pass transistor circuit 360 in response to the block address. The block selection driver 320 may supply the high voltage to the block word-line BLKWL coupled to gates of a plurality of pass transistors GPT, PTP~PTn and SSPT in the pass transistor circuit 36. Here, n is an integer greater than one. The block selection driver 320 may control the application of various voltages such as a pass voltage, a program voltage, a read voltage to the memory cell array 200.

The string selection driver 330 may supply a selection voltage SS from the voltage generator 500 as to the string selection line SSL through the pass transistor SSPT as a string selection signal SS. During a program operation, the string selection driver 330 may supply the selection voltage SS so as to turn on all string selection transistors in a selected memory block.

During a program operation, the driving line driver 340 may supply the program voltage, the pass voltage and the read voltage from the voltage generator 500 to word-lines WL1~WLn through driving lines S1~Sn and the pass transistors PT1~PTn.

The ground selection driver 350 may supply a ground selection signal GS from the voltage generator 500 as the ground selection line GSL through the pass transistor GPT.

The pass transistors GPT, PT1~PTn and SSPT are configured such that the ground selection line GSL, the word-lines WL1~WLn and the string selection line SSL are electrically connected to corresponding driving lines, in response to activation of the high voltage on the block word-line BLKWL. In example embodiments, each of the pass transistors GPT, PT1~PTn and SSPT may include a high voltage transistor capable of enduring high-voltage.

Figure 13:
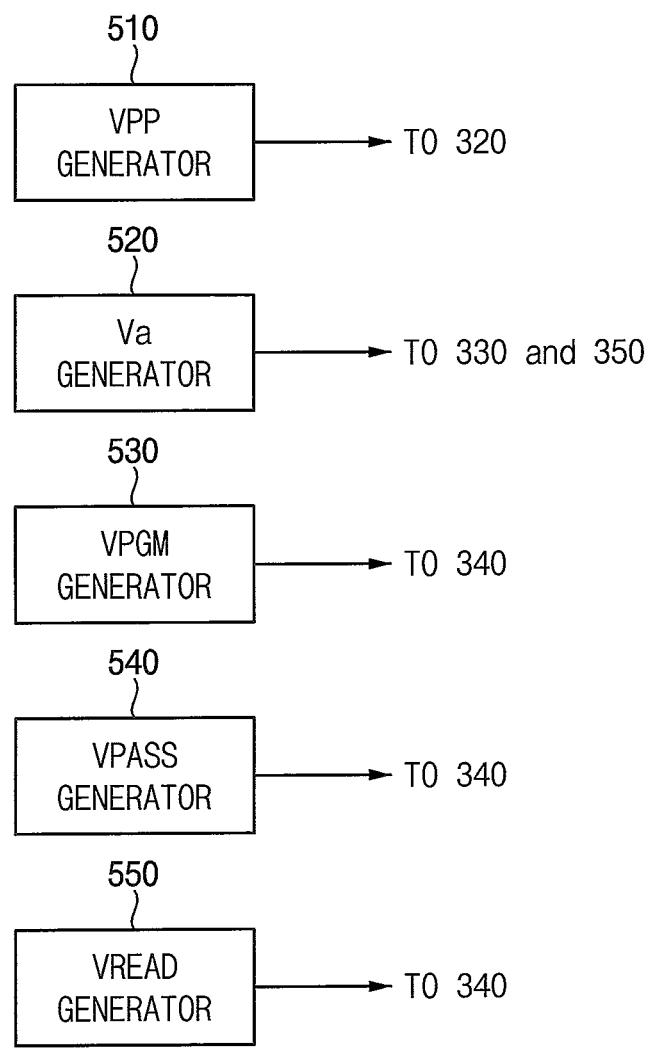
FIG. 13 is a block diagram illustrating an example of the voltage generator in the nonvolatile memory device of FIG. 6 according to example embodiments.

FIG. 13 is a block diagram illustrating an example of the voltage generator in the nonvolatile memory device of FIG. 6 according to example embodiments.

Referring to FIG. 13, the voltage generator 500 may include a high voltage generator VPP generator 510, a selection voltage generator Va GENERATOR 520, a program voltage generator VPGM GENERATOR 530, a pass voltage generator VPASS GENERATOR 540 and a read voltage generator VREAD GENERATOR 550.

The high voltage generator 510 may generate a high voltage to be supplied to the block selection driver 320. The selection voltage generator 520 may generate selection voltages (SS and GS in FIG. 12) to be supplied to the string selection line SSL and the ground selection line GSL, respectively and may provide the selection voltages to the string selection driver 330 and the ground selection driver 350.

The program voltage generator 530 may generate a program voltage to be supplied to a selected word-line during a program operation. The program voltage generator 530 may generate a step voltage according to an incremental step pulse programming (ISPP) method and provide the step voltage to the driving line driver 340. The pass voltage generator 540 may generate a pass voltage to be supplied to the unselected word-lines during a program operation and provide the pass voltage to the driving line driver 340. The read voltage generator 550 may generate a read voltage to be supplied to the unselected word-lines during a read operation and provide the read voltage to the driving line driver 340.

Figure 14:
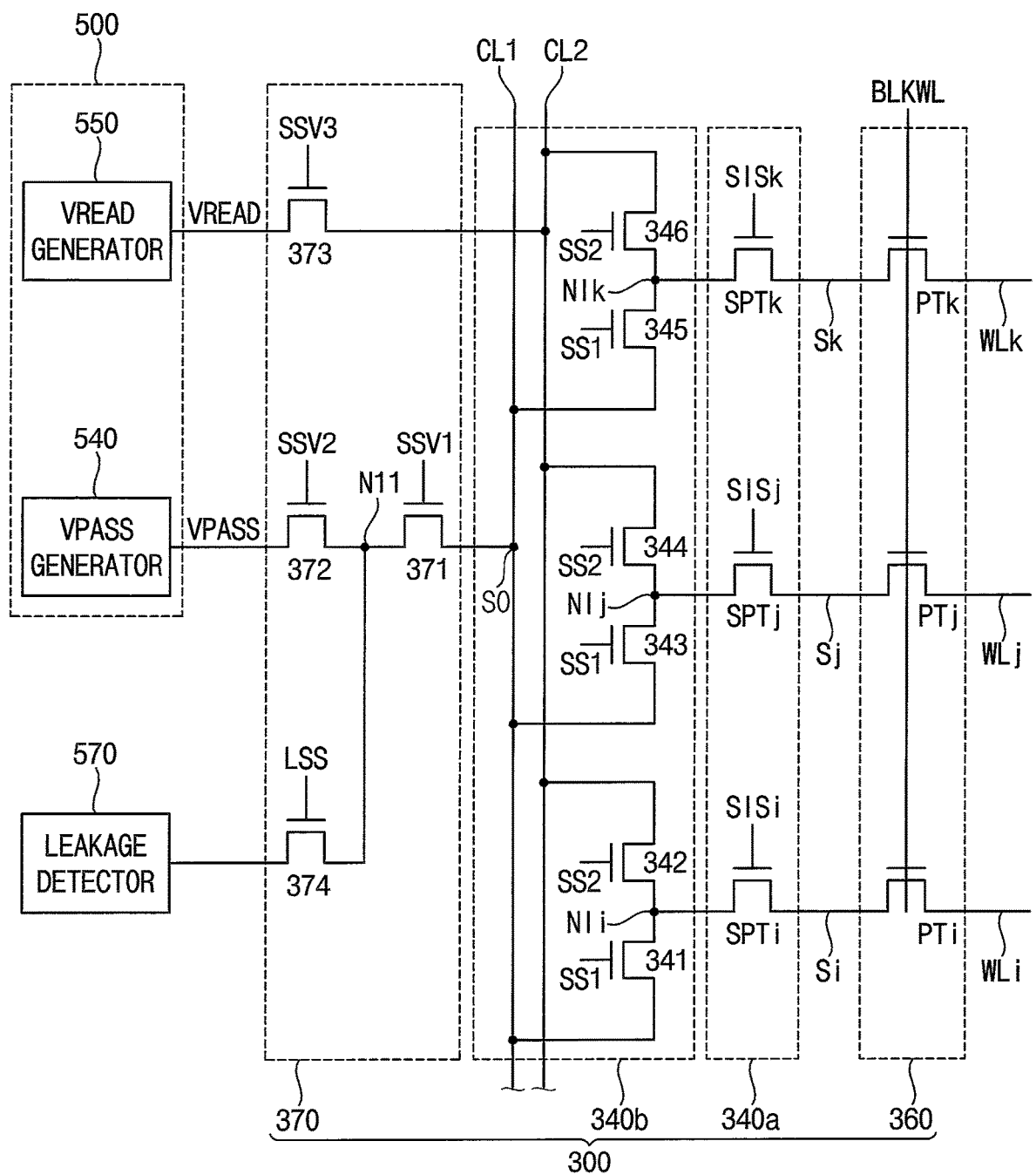
FIG. 14 illustrates a portion of the nonvolatile memory device of FIG. 6 according to example embodiments.

FIG. 14 illustrates a portion of the nonvolatile memory device of FIG. 6 according to example embodiments.

FIG. 14 illustrates the address decoder 300, the voltage generator 500 and the leakage detector 570 which are associated with a leakage detection operation. The pass voltage generator 540 and the read voltage generator 550 of the voltage generator 500 are illustrated.

Referring to FIG. 14, the address decoder 300 may include the pass transistor circuit 360, a selection switch circuit 340a, a first voltage transfer circuit 340b and a second voltage transfer circuit 370. The selection switch circuit 340a, the first voltage transfer circuit 340b and the second voltage transfer circuit 370 may correspond to the driving line driver 340 in FIG. 12.

The pass transistor circuit 360 may include a plurality of pass transistors PTj, PTj and PTk which are disposed between word-lines WLi, WLj and WLk and driving lines Si, Sj and Sk, and connect each of the word-lines WLi, WLj and WLk to respective one of the driving lines Si, Sj and Sk. Each gate of the pass transistors PTi, PTj and PTk is connected to the block word-line BLKWL and each of the pass transistors PTi, PTj and PTk may connect each of the word-lines WLi, WLj and WLk to respective one of the driving lines Si, Sj and Sk in response to the high-voltage on the block word-line BLKWL. Here, i is an integer greater than zero, j is an integer greater than i and k is an integer greater than j.

In example embodiments, each of the pass transistors PTi, PTj and PTk may include a high voltage n-channel metal-oxide semiconductor (NMOS) transistor.

The selection switch circuit 340a may include selection transistors SPTi, SPTj and SPTk which are connected to the first voltage transfer circuit 340b and to respective one of the pass transistors PTi, PTj and PTk. Each of the selection transistors SPTi, SPTj and SPTk may be selectively turned-on in response to respective one of driving line selection signals SISi, SISj and SISk applied to a gate of respective one of the selection transistors SPTi, SPTj and SPTk, and may provide voltages from the first voltage transfer circuit 340b to at least a portion of driving lines Si, Sj and Sk.

The driving line selection signals SISi, SISj and SISk may be included in the switching control signal SCS in FIG. 6.

In example embodiments, each of the selection transistors SPTi, SPTj and SPTk may include an NMOS transistor.

The first voltage transfer circuit 340b may include a plurality of NMOS transistors 341, 342, 343, 344, 345 and 346 connected between a connection line CL1 and a connection line CL2.

The NMOS transistor 341 is connected between the connection line CL1 and an internal node NIi which is coupled to the selection transistor SPTi, and has a gate receiving a selection signal SS1. The NMOS transistor 342 is connected between the connection line CL2 and the internal node NIi, and has a gate receiving a selection signal SS2.

The NMOS transistor 343 is connected between the connection line CL1 and an internal node NIj which is coupled to the selection transistor SPTj, and has a gate receiving the selection signal SS1. The NMOS transistor 344 is connected between the connection line CL2 and the internal node NIj, and has a gate receiving the selection signal SS2.

The NMOS transistor 345 is connected between the connection line CL1 and an internal node NIk which is coupled to the selection transistor SPTk, and has a gate receiving the selection signal SS1. The NMOS transistor 346 is connected between the connection line CL2 and the internal node Nik, and has a gate receiving the selection signal SS2.

The NMOS transistors 341, 343 and 345 are turned-on in response to the selection signal SS1 and may provide voltages from the connection line CL1 to the driving lines Si, Sj and Sk through the selection transistors SPTi, SPTj and SPTk. The NMOS transistors 342, 344 and 346 are turned-on in response to the selection signal SS2 and may provide voltages from the connection line CL2 to the driving lines Si, Sj and Sk through the selection transistors SPTi, SPTj and SPTk.

The selection signals SS1 and SS2 may be included in the switching control signal SCS in FIG. 6.

The second voltage transfer circuit 370 may include NMOS transistors 371, 372, 373 and 374.

The NMOS transistor 371 is connected between a sensing node SO which is coupled to the connection line CL1 and a node N11, and has a gate receiving a switching control signal SSV1. The NMOS transistor 372 is connected between the node N11 and the pass voltage generator 540 to receive a pass voltage VPASS, and has a gate receiving a switching control signal SSV2. The NMOS transistors 371 and 372 may be selectively turned-on in response to the switching control signals SSV1 and SSV2, and may transfer the pass voltage VPASS to the driving lines Si, Sj and Sk via the node N11 and the sensing node SO.

The NMOS transistor 374 is connected between the node N11 and the leakage detector 570, and has a gate receiving a switching control signal LSS. The NMOS transistor 374 may be selectively turned-on in response to the switching control signal LSS and may provide a voltage of the sensing node SO to the leakage detector 570 via the node N11.

The NMOS transistor 373 is connected between the connection line CL2 and the read voltage generator 550 to receive a read voltage VREAD and has a gate receiving a switching control signal SSV3. The NMOS transistor 373 may be selectively turned-on in response to the switching control signal SSV3 and may transfer the read voltage VREAD to the driving lines Si, Sj and Sk via the connection line CL2.

The switching control signals SSV1, SSV2, SSV3 and LSS may be included in the switching control signal SCS in FIG. 6.

Figure 15:
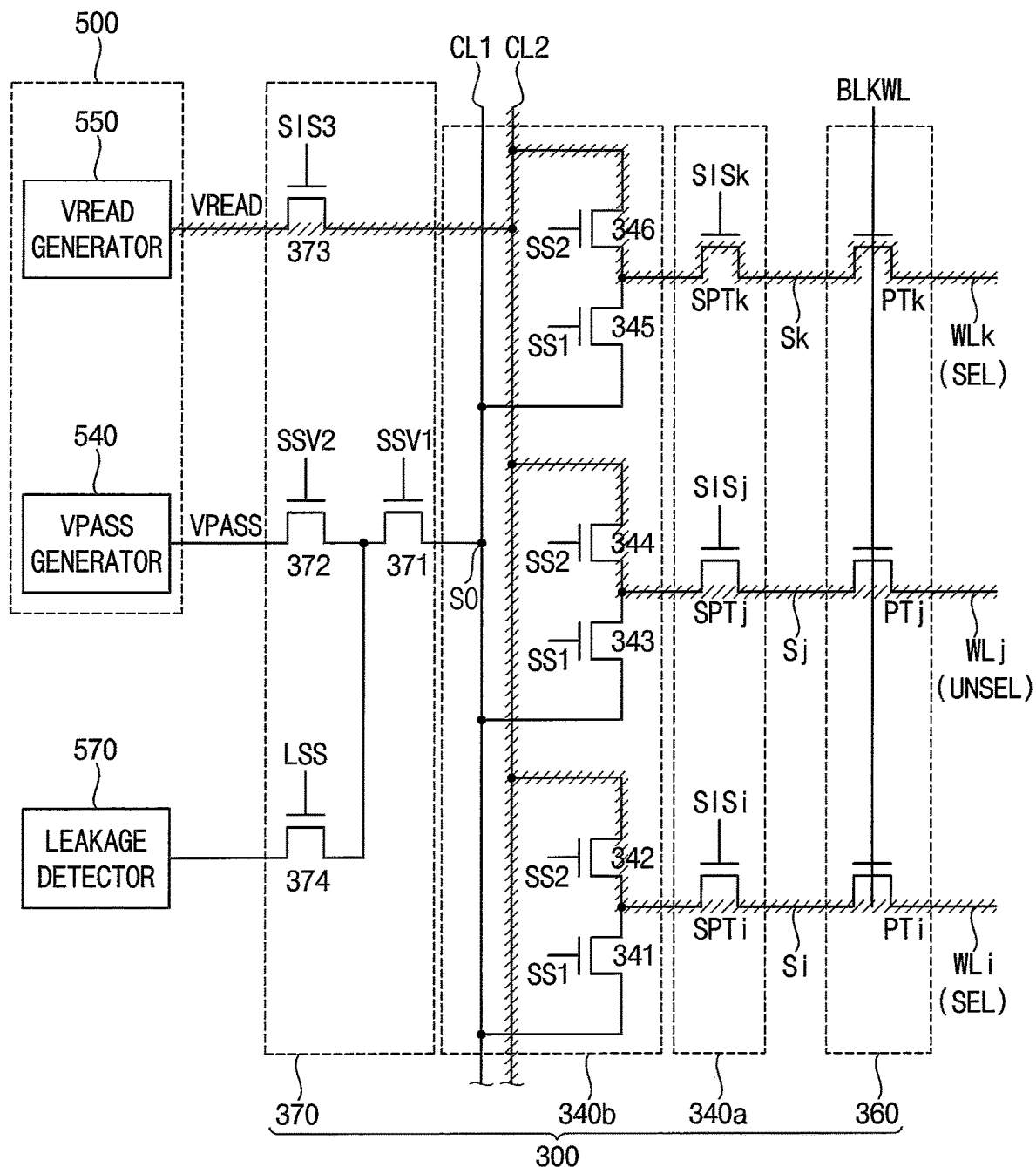
FIG. 15 illustrates an operation of the nonvolatile memory device of FIG. 14 during the word-line set-up period.

FIG. 15 illustrates an operation of the nonvolatile memory device of FIG. 14 during the word-line set-up period.

Referring to FIG. 15, during the word-line set-up period, the word-lines WLi, WLj and WLk are set-up with a third voltage by applying a second voltage to the driving lines Si, Sj and Sk using the read voltage VREAD provided from the read voltage generator 550. The second voltage may be applied to the driving lines Si, Sj and Sk by turning-on the NMOS transistor 373, turning-off the NMOS transistors 371 and 372, turning-off the NMOS transistors 341, 343, 345, turning-on the NMOS transistors 342, 344, 346, turning-on the selection transistors SPTi, SPTj and SPTk and applying a first voltage to the block word-line BLKWL to turn-on the pass transistors PTj, PTj and PTk.

In FIG. 15, the word-lines WLi and WLk may correspond to selected word-lines SEL and the word-line WLj may correspond to an unselected word-line UNSEL.

Figure 16:
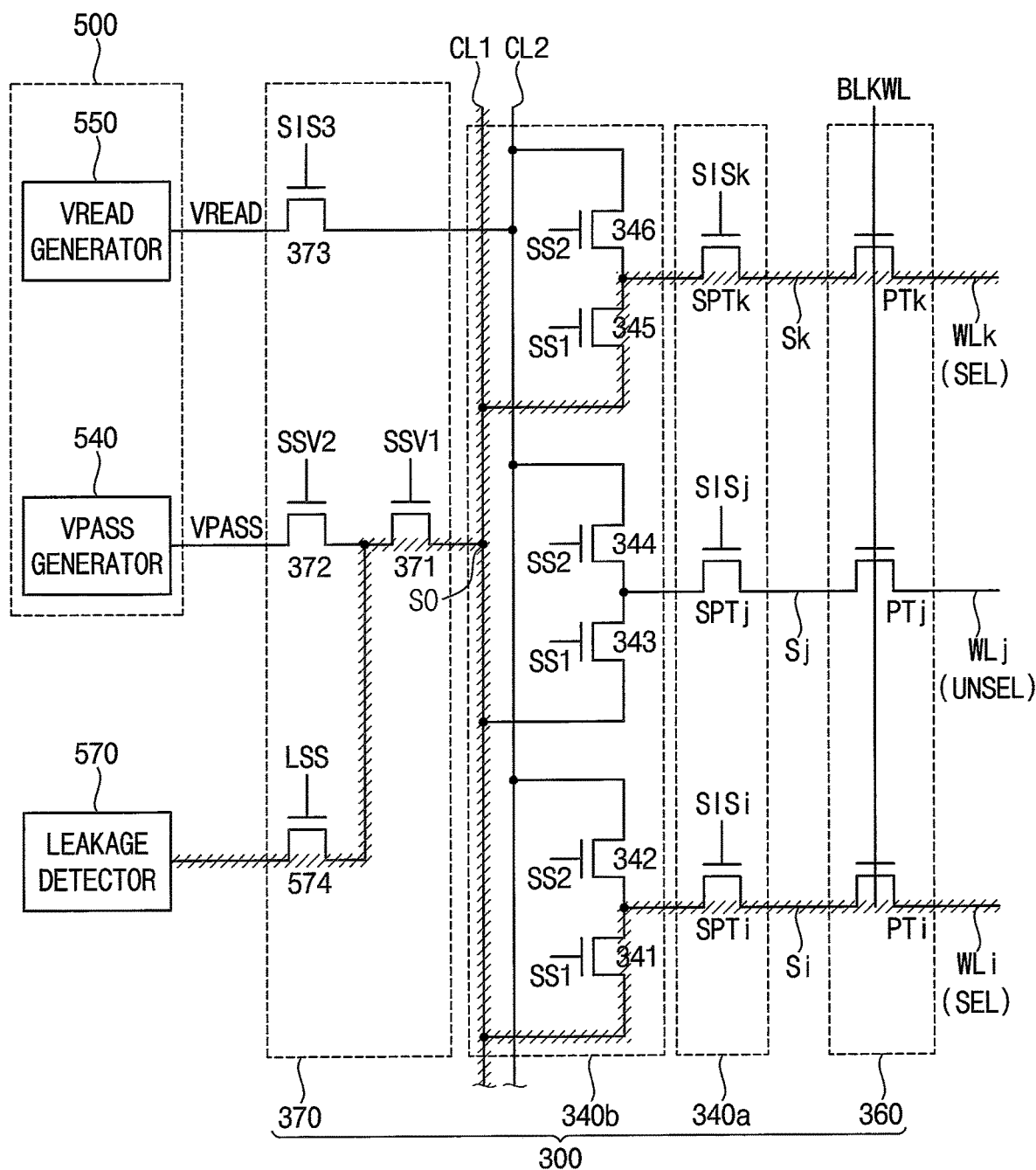
FIG. 16 illustrates an operation of the nonvolatile memory device of FIG. 14 during the word-line development period.

FIG. 16 illustrates an operation of the nonvolatile memory device of FIG. 14 during the word-line development period.

Referring to FIG. 16, during the word-line development period, the word-lines (even word-lines) WLi, WLk are developed, while the driving lines Si, Sj and Sk are precharged with the second voltage using the read voltage VREAD provided from the read voltage generator 550 by applying a fourth voltage to the block word-line BLKWL to turn-off the pass transistors PTj, PTj and PTk, turning-off the NMOS transistor 373, turning-on the NMOS transistor 371, turning-off the NMOS transistor 372, turning-on the NMOS transistors 341 and 345, turning-off the NMOS transistors 342, 343, 344 and 346, and turning-on the selection transistors SPTi, SPTj and SPTk. The connection line CL1 connected to the leakage detector 570 may be precharged with the second voltage.

In FIG. 16, the word-lines WLi and WLk may correspond to selected word-lines SEL and the word-line WLj may correspond to an unselected word-line UNSEL.

Figure 17:
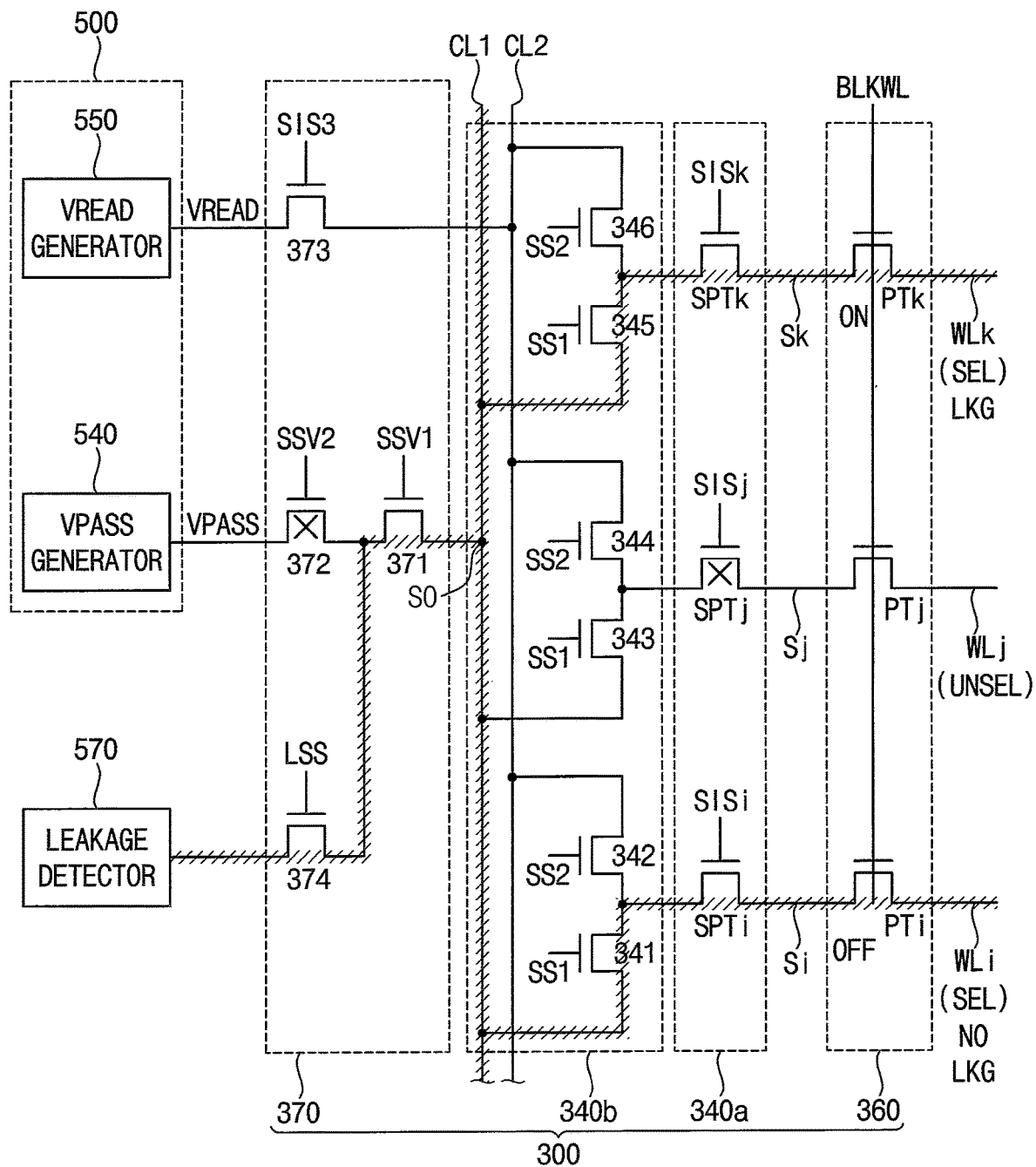
FIG. 17 illustrates an operation of the nonvolatile memory device of FIG. 14 during the sensing period.

FIG. 17 illustrates an operation of the nonvolatile memory device of FIG. 14 during the sensing period.

Referring to FIG. 17, during the sensing period, one or more of the driving lines Si and Sk may be connected to respective ones of the word-lines (even word-lines) WLi and WLk by applying a fifth voltage to each gate of the pass transistors PTj, PTj and PTk through the block word-line BLKWL, turning-on the NMOS transistor 373, turning-off the NMOS transistor 372, turning-on the NMOS transistors 341 and 345, turning-off the NMOS transistors 342, 343, 344, 346, and turning-on the selection transistors SPTi, SPTj and SPTk. The connection line CL1 connected to the leakage detector 570 may be precharged with the second voltage.

Assuming that leakage LKG occurs in the word-line WLk and the word-line WLi is a normal word-line in which no leakage NO LKG occurs, a threshold voltage of the pass transistor PTk is reduced because of a voltage level at a terminal of the pass transistor PTk, coupled to the word-line WLk is reduced. Thus, the pass transistor PTk is turned-on by the fifth voltage, whereas the pass transistor PTi remains in an off state.

Since the pass transistor PTk is turned-on, charge sharing occurs between the word-line WLk and the driving line Sk, a voltage level of the driving line Sk is reduced and a voltage level of the sensing node SO is reduced because the sensing node SO is connected to the driving line Sk through the NMOS transistor 345 and the selection transistor SPTk. The leakage detector 570, coupled to the sensing node SO through the NMOS transistors 374 and 371, compares the voltage level of the sensing node SO with a reference voltage and may provide the leakage detection signal LDS to the control circuit 450 in FIG. 6 based on a result of the comparison, when the voltage level of the sensing node SO is reduced below the reference voltage.

The control circuit 450 may determine that leakage occurs at least one of the selected word-lines WLi and WLj in response to activation of the leakage detection signal LDS.

Figure 18:
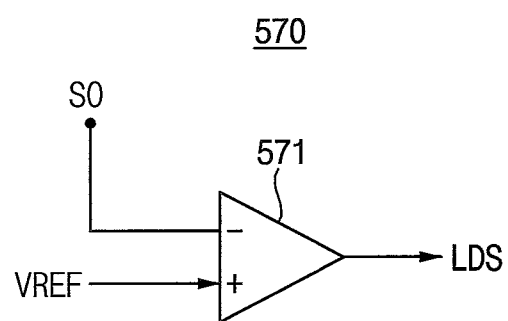
FIG. 18 illustrates an example of the leakage detector in the nonvolatile memory device of FIG. 14 according to example embodiments.

FIG. 18 illustrates an example of the leakage detector in the nonvolatile memory device of FIG. 14 according to example embodiments.

Referring to FIG. 18, the leakage detector 570 may include a comparator 571. The comparator 571 may include a negative (−) input terminal connected to the sensing node SO, a positive (+) input terminal to receive a reference voltage VREF and an output terminal to provide the leakage detection signal LDS.

As described with reference to FIG. 17, when the comparator 571 is coupled to the sensing node SO through the NMOS transistors 374 and 371 during the sensing period, the comparator 571 may compare the voltage level of the sensing node SO with the reference voltage VREF and may provide the leakage detection signal LDS to the control circuit 450 in FIG. 6 based on a result of the comparison, when the voltage level of the sensing node SO is reduced below the reference voltage VREF.

In FIGS. 12 and 14 through 18, it is described as the leakage detection operation is performed on the word-lines WL1~WLn. However, example embodiments are not limited thereto, and the leakage detection operation according to example embodiments may be performed on the string selection line SSL and the ground selection line GSL in FIG. 12.

Figure 19A:
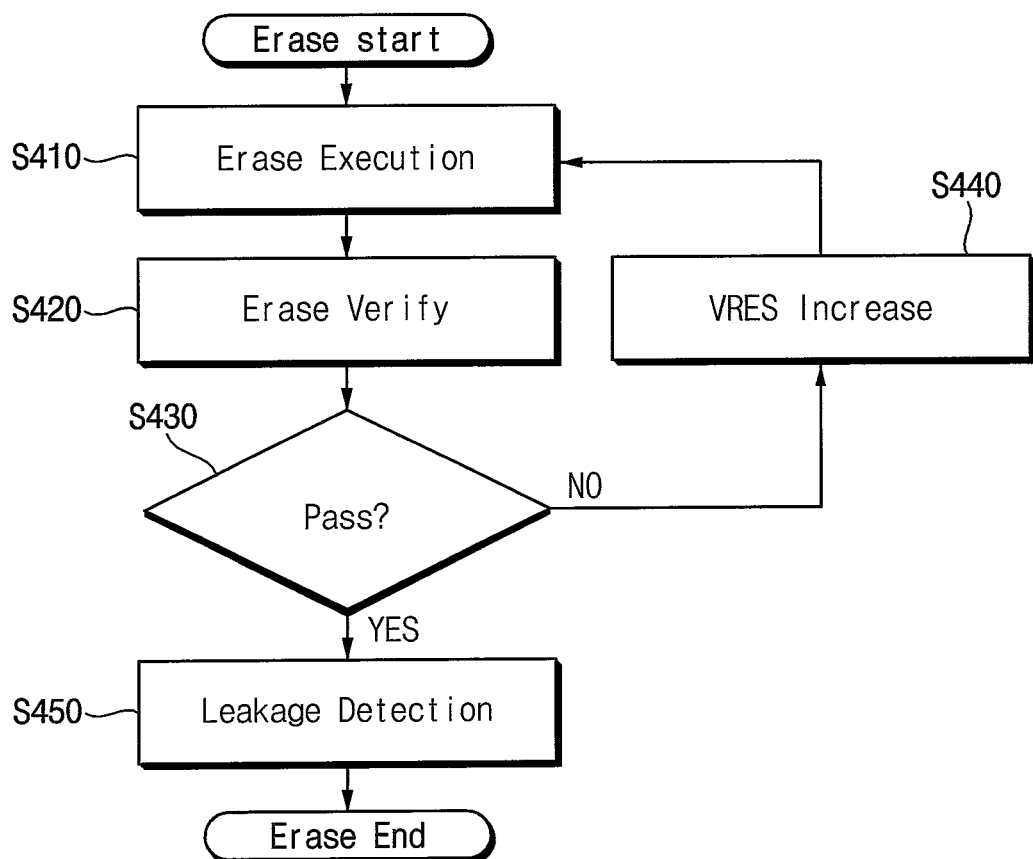
FIG. 19A is a flow chart illustrating an example in which a leakage detection operation is applied to an erase loop of the nonvolatile memory device.

FIG. 19A is a flow chart illustrating an example in which a leakage detection operation is applied to an erase loop of the nonvolatile memory device.

Referring to FIGS. 6 and 19A, an erase loop starts, the control circuit 450 may perform an erase operation on a selected memory block (operation S410). The control circuit 450 may perform an erase verification operation on word-lines of the selected memory block (operation S420).

The control circuit 450 determines whether the word-lines pass the erase verification operation (operation S430). When the word-lines do not pass the erase verification operation (NO in operation S430), the control circuit 450 increases an erase voltage VERS (operation S440) and performs the operations S410, S420 and S430 based on the increased erase voltage.

When the word-lines pass the erase verification operation (YES in operation S430), the control circuit 450 may perform the leakage detection operation on the word-lines of the selected memory block as described above (operation S450).

The control circuit 450 may perform the leakage detection operation by applying a first voltage to a block word-line coupled to each gate of a plurality of pass transistors which connect a string selection line, a plurality of word-lines and a ground selection line to respective one of a plurality of driving lines, applying a second voltage to the plurality of driving lines, commonly coupled to a sensing node, to set-up the plurality of word-lines with a third voltage during a word-line set-up period, where the string selection line is coupled to the string selection transistor, the plurality of word-lines are coupled to the memory cells and the ground selection line is coupled to the ground selection transistor; while precharging plurality of driving lines with the second voltage, developing target word-lines from among the plurality of word-lines by applying a fourth voltage to the block word-line to turn-off the plurality of pass transistors, during a word-line development period; and detecting whether leakage occurs in at least a portion of the target word-lines by applying a fifth voltage smaller than the first voltage to the block word-line and by detecting a voltage drop of the sensing node.

Figure 19B:
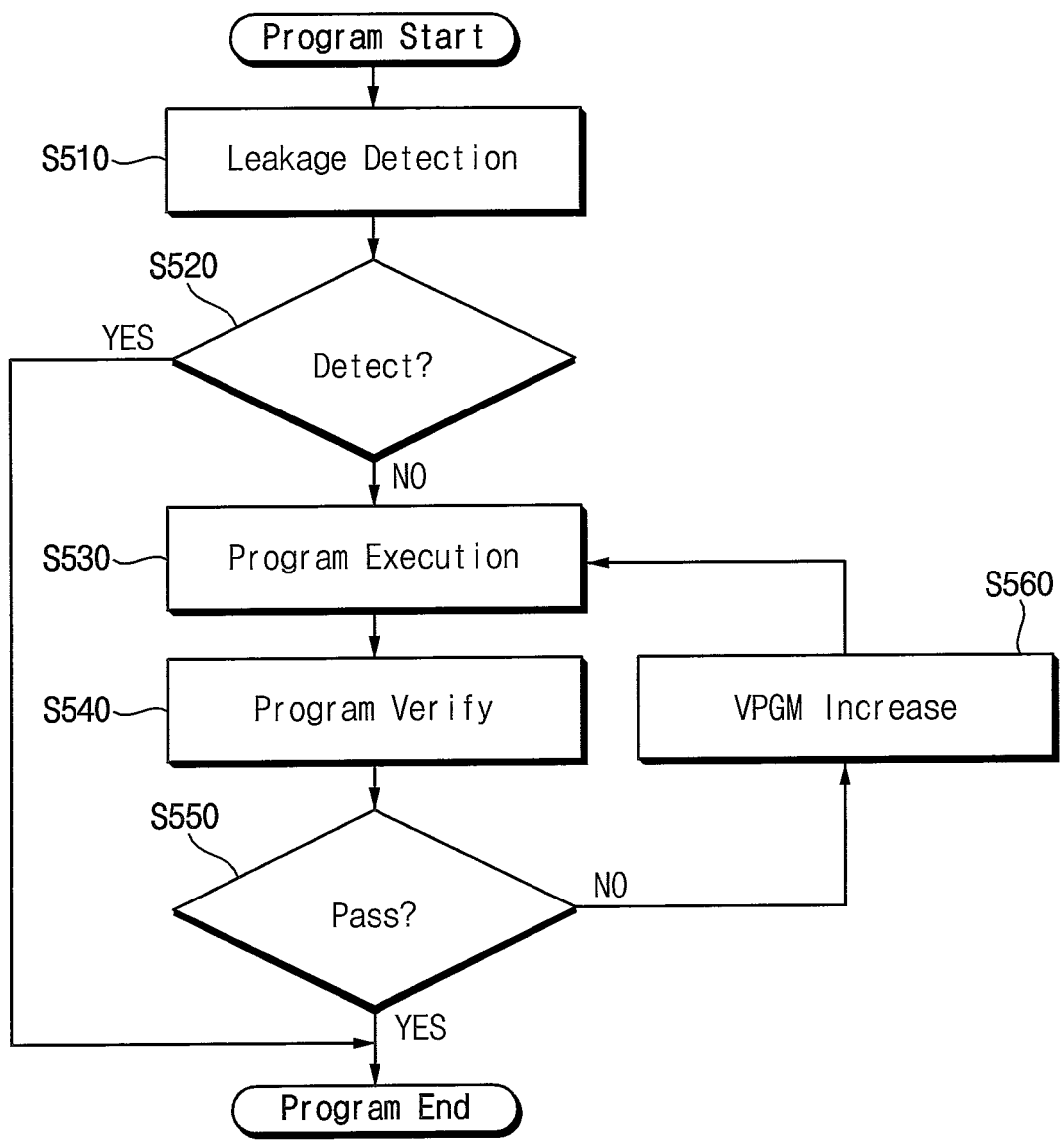
FIG. 19B is a flow chart illustrating an example in which a leakage detection operation is applied to an erase loop of the nonvolatile memory device.

FIG. 19B is a flow chart illustrating an example in which a leakage detection operation is applied to an erase loop of the nonvolatile memory device.

Referring to FIGS. 6 and 19B, an erase loop starts, the control circuit 450 performs leakage detection operation on word-lines of a selected memory block (operation S510).

The control circuit 450 may determine whether a leakage is detected (or, occurs) in at least a portion of the word-lines of the selected memory block (operation S520).

When the leakage is not detected (NO in operation S520), the control circuit 450 may perform a program operation on a selected word-line of the selected memory block (operation S530). The control circuit 450 may perform a program verification operation on the selected word-line (operation S540).

The control circuit 450 determines that the selected word-line passes the program verification operation (operation S550). When the selected word-line does not pass the program verification operation (NO in operation S550), the control circuit 450 increases a program voltage VPGM (operation S440) and performs the operations S530, S540 and S550 based on the increased program voltage.

When the selected word-line passes the program verification operation (YES in operation S550), the control circuit 450 may complete the program loop.

When the leakage is detected (YES in operation S520), the control circuit 450 may complete the program loop without performing the program operation on the selected memory block.

Figure 20A:
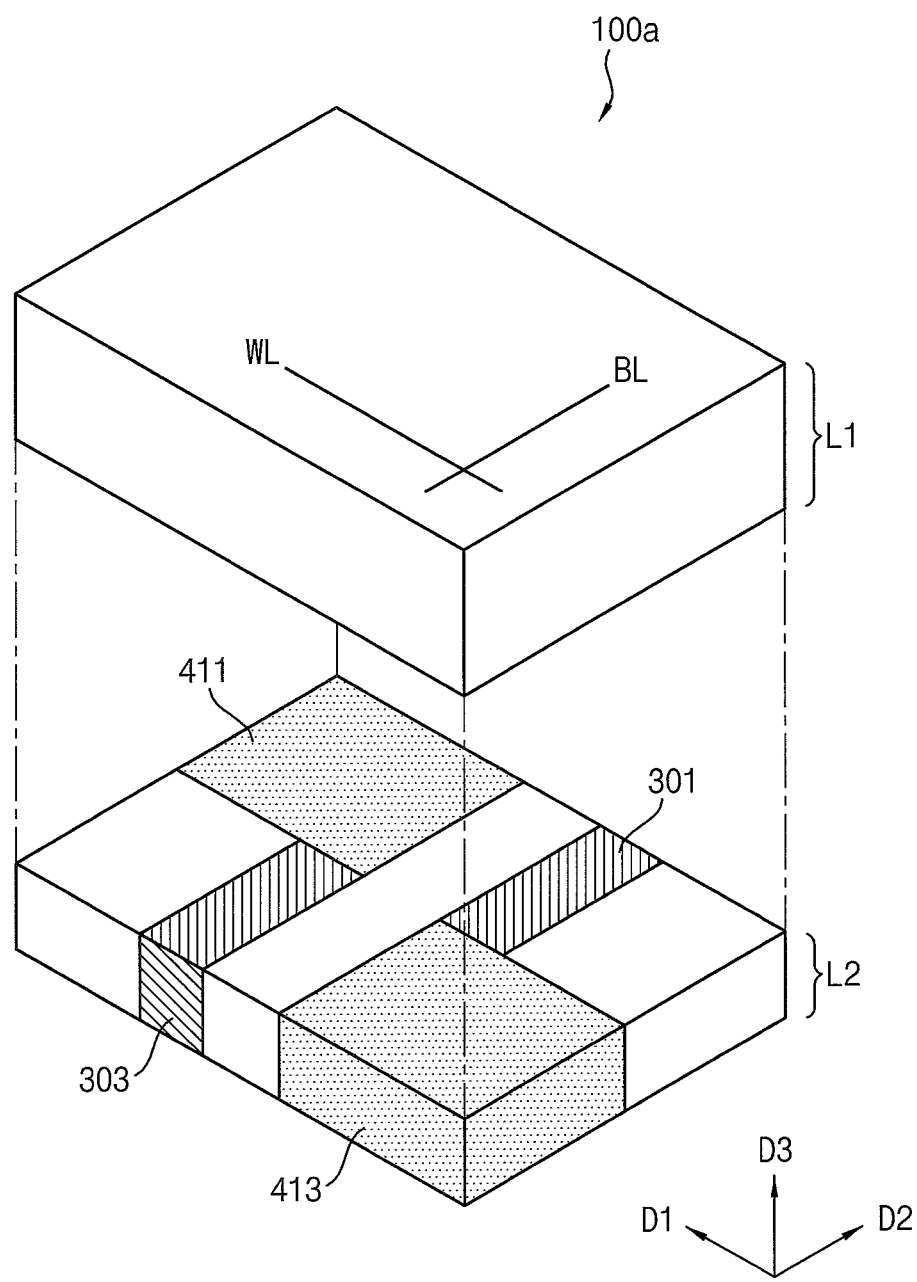
FIG. 20A is a view illustrating a structure of the nonvolatile memory device including the first and second semiconductor layers according to example embodiments.
Figure 20B:
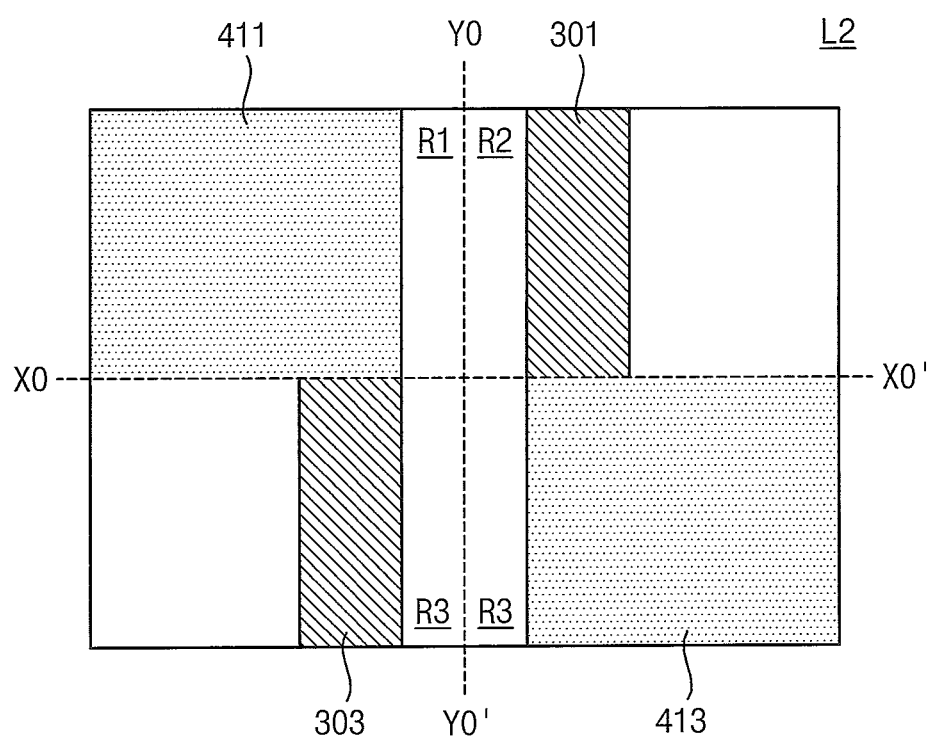
FIG. 20B is a plan view illustrating a top surface of the second semiconductor layer contacting the first semiconductor layer of the nonvolatile memory device according to example embodiments.
Figure 20C:
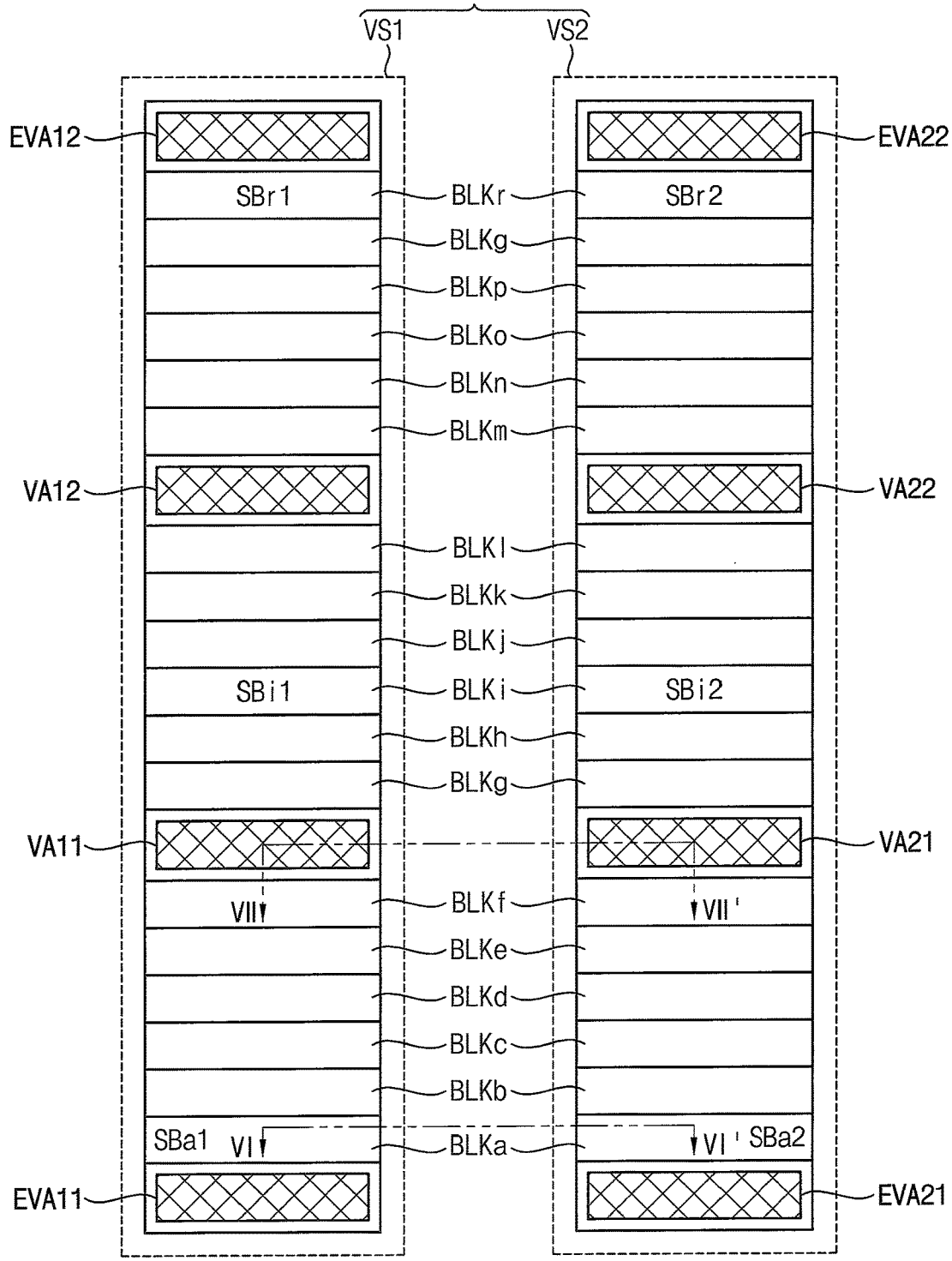
FIG. 20C is a plan view illustrating a top surface of the first semiconductor layer, overlapping the plan view of the FIG. 20B.

FIG. 20A is a view illustrating a structure of the nonvolatile memory device including the first and second semiconductor layers according to example embodiments. FIG. 20B is a plan view illustrating a top surface of the second semiconductor layer contacting the first semiconductor layer of the nonvolatile memory device according to example embodiments. FIG. 20C is a plan view illustrating a top surface of the first semiconductor layer, overlapping the plan view of the FIG. 20B.

In FIGS. 20A to 20C, the first and second semiconductor layers L1 and L2 are spaced apart from each other in the third direction for convenience of explanation. However, a bottom surface of the first semiconductor layer L1 and the top surface of the second semiconductor layer L2 actually (e.g., directly) contact each other.

Referring to FIGS. 20A through 20C, the first and second address decoders 301 and 303, which may be included in the address decoder 300 in FIG. 6, may extend in a direction (e.g., the second direction in which the word-lines WL are arranged) perpendicular to a direction in which the word-lines WL extend. In addition, the first and second page buffer circuits 411 and 413, which may be included in the page buffer circuit 410 in FIG. 6, may extend in a direction (e.g., the first direction in which the bit-lines BL are arranged) perpendicular to the bit-lines BL. In other words, in the nonvolatile memory device 100 having a COP structure, the address decoder 300 (see FIG. 6) and the page buffer circuit 410 (see FIG. 6) may be divided into two or more parts and may be arranged as shown in FIGS. 20A and 20B to increase the area of the address decoder 300 and the page buffer circuit 410 overlapping the memory cell array 200 (see FIG. 6) of the first semiconductor layer L1 in the third direction.

Referring to FIG. 20B, the second semiconductor layer L2 may be divided into first through fourth regions R1 through R4 by a first virtual line X0-X0' in the first direction parallel to the word-lines WL and a second virtual line Y0-Y0' in the second direction parallel to the bit-lines BL.

For example, the first virtual line X0-X0' and the second virtual line Y0-Y0' may overlap the memory cell array 200 (see FIG. 6) located on the first semiconductor layer L1 in the third direction. In other words, at least a part of each of the first through fourth regions R1 through R4 may overlap the memory cell array 200 located on the first semiconductor layer L1 in the third direction. The first and second address decoders 301 and 303 may be respectively located in the second and third regions R2 and R3, and the first and second page buffer circuits 411 and 413 may be respectively located in the first and fourth regions R1 and R4.

Referring to FIG. 20C, the memory cell array 200 may be located on the first semiconductor layer L1, and the memory cell array 200 may include a first vertical structure VS1 and a second vertical structure VS2. As shown in FIG. 20C, the memory cell array 200 may include a plurality of memory blocks BLKa~BLKr formed as the first and second vertical structures VS1 and VS2. The memory blocks BLK1~BLKr may be arranged in the second direction. Each of the memory blocks BLKa~BLKr may include a first sub-block and a second sub-block. The memory block BLKa includes a first sub-block SBa1 and a second sub-block SBa2. The memory block BLKi includes a first sub-block SBi1 and a second sub-block SBi2. The memory block BLKr includes a first sub-block SBr1 and a second sub-block SBr2.

As shown in FIG. 20C, the first vertical structure VS1 may include a plurality of first sub-blocks of the memory blocks BLKa~BLKr and a plurality of first via areas EVA11, VA11, VA12 and EVA12 which are spaced apart in a second direction. In addition, the second vertical structure VS2 may include a plurality of second sub-blocks of the memory blocks BLKa~BLKr and a plurality of second via areas EVA21, VA21, VA22 and EVA22 which are spaced apart in a second direction. The first sub-blocks may be arranged among the first via areas EVA11, VA11, VA12 and EVA12 and the second sub-blocks may be arranged among the second via areas EVA21, VA21, VA22 and EVA22.

The first via areas EVA11 and EVA12 adjacent to edges in a second direction and in the first sub-blocks may be referred to as first and second edge via areas, respectively. The first via areas EVA21 and EVA22 adjacent to edges in a second direction and in the second sub-blocks may be referred to as third and fourth edge via areas, respectively.

For example, in the first via areas VA11 and VA12, one or more first through-hole vias that each pass through the first vertical structure VS1 and are connected to the first page buffer circuit 411 may be formed. In addition, in the second via areas VA21 and VA22, one or more second through-hole vias that each pass through the second vertical structure VS22 and are connected to the second page buffer circuit 413 may be formed. For example, in the first and second edge via areas EVA11 and EVA12, one or more edge through-hole vias that each pass through the first vertical structure VS1 and are connected to the second address decoder 603 may be formed. In addition, in the third and fourth edge via areas EVA21 and EVA22, one or more edge through-hole vias that each pass through the second vertical structure VS22 and are connected to the first address decoder 601 may be formed.

Figure 20D:
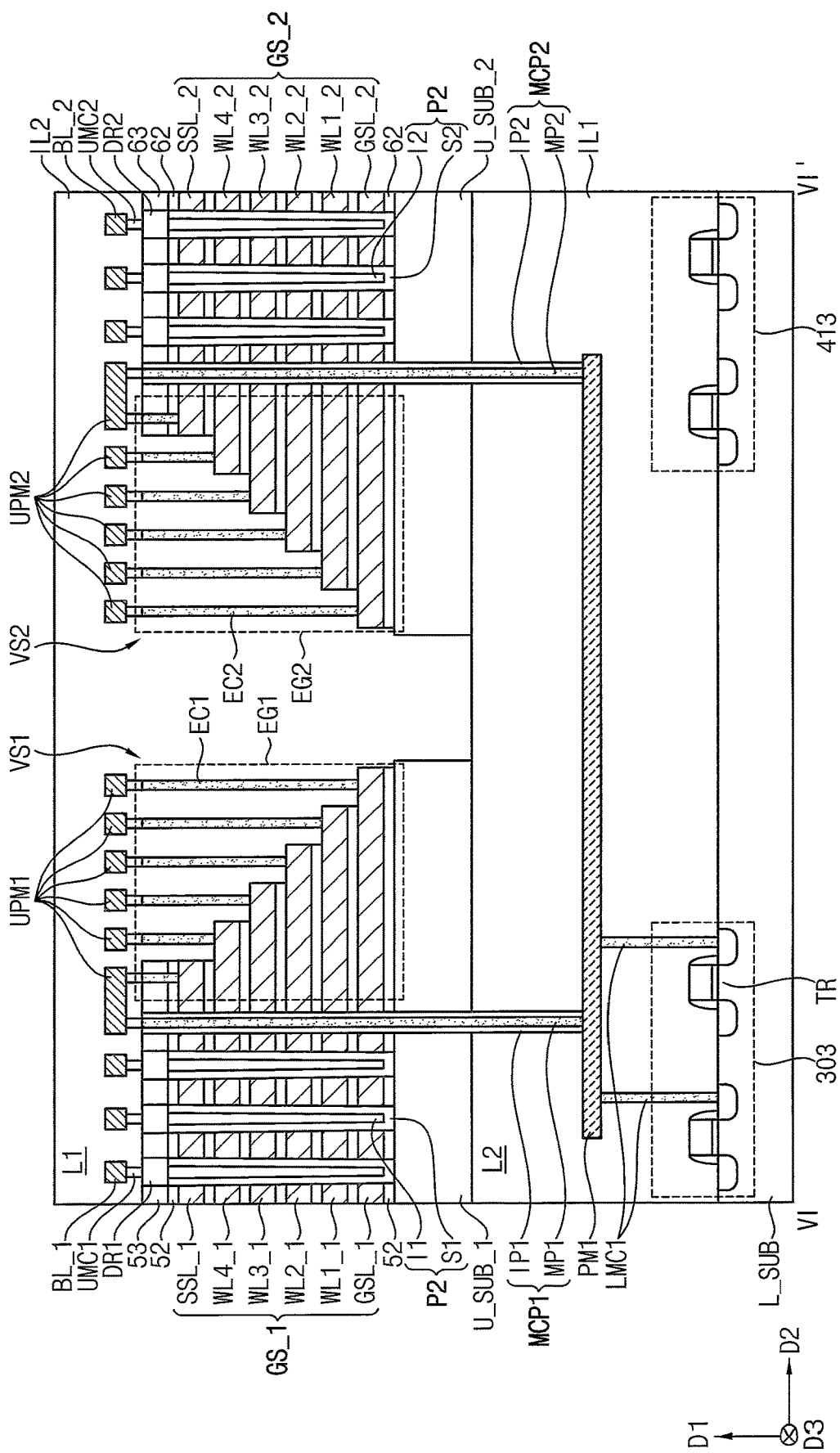
FIG. 20D is a cross-sectional view of the nonvolatile memory device according to example embodiments.

FIG. 20D is a cross-sectional view of the nonvolatile memory device according to example embodiments. For example, FIG. 20D is a cross-sectional view taken along line VI-VI' of FIG. 20C, illustrating configurations of the first and second semiconductor layers.

Referring to FIG. 20D, the second semiconductor layer L2 may include a lower substrate L_SUB, and the second address decoder 303 and the second page buffer circuit 413 formed on the lower substrate L_SUB. In addition, the second semiconductor layer L2 may include a plurality of first lower contacts LMC1 electrically connected to the second address decoder 603, a first lower conductive line PM1 electrically connected to the plurality of first lower contacts LMC1, and a lower insulating layer IL1 covering the plurality of first lower contacts LMC1 and the first lower conductive line PM1.

The second address decoder 303 and the second page buffer circuit 413 may be formed on portions of the lower substrate L_SUB. In other words, the second address decoder 603 and/or the second page buffer circuit 413 may be formed by forming a plurality of transistors TR on the lower substrate L_SUB.

The first semiconductor layer L1 may include a first upper substrate U_SUB_1, a second upper substrate U_SUB_2, the first vertical structure VS1 located on the first upper substrate U_SUB_1, and the second vertical structure VS2 located on the second upper substrate U_SUB_2. In addition, the first semiconductor layer L1 may include a plurality of first upper contacts UMC1, a plurality of first bit-lines BL1, a plurality of first edge contacts EC1, and a plurality of first upper conductive lines UPM1 which are electrically connected to the first vertical structure VS1.

In addition, the first semiconductor layer L1 may include a plurality of second upper contacts UMC2, a plurality of second bit-lines BL2, a plurality of second edge contacts EC2, and a plurality of second upper conductive lines UPM2 which are electrically connected to the second vertical structure VS2. In addition, the first semiconductor layer L1 may include an upper insulating layer IL2 covering the first and second vertical structures VS1 and VS2 and various conductive lines.

The first and second upper substrates U_SUB_1 and U_SUB_2 may be support layers that respectively support first and second gate conductive layers GS_1 and GS_2. The first and second upper substrates U_SUB_1 and U_SUB_2 may be, for example, base substrates. The first vertical structure VS1 may include the first gate conductive layers GS_1 located on the first upper substrate U_SUB_1, and a plurality of pillars P1 that pass through the first gate conductive layers GS_1 and extend in the third direction on a top surface of the first upper substrate U_SUB_1. The first gate conductive layers GS_1 may include a ground selection line GSL_1, word-lines WL1_1 through WL4_1, and a string selection line SSL_1. The ground selection line GSL_1, the word-lines WL1_1 through WL4_1, and the string selection line SSL_1 may be sequentially formed on the first upper substrate U_SUB_1, and an insulating layer 52 may be located under or over each of the first gate conductive layers GS_1. Since the first and second vertical structures VS1 and VS2 have corresponding configurations in the cross-sectional view taken along line VI-VI' of the first memory block BLK1 of FIG. 20D, a repeated explanation of elements of the second vertical structure VS2 corresponding to those of the first vertical structure VS1 may not be given.

The second vertical structure VS2 may include a plurality of pillars P2 that pass through the second gate conductive layers GS_2. Each of the pillars P2 may include a surface layer S2 and an inside I1. The second gate conductive layers GS_2 may include a ground selection line GSL_2, word-lines WL1_2 through WL4_2, and a string selection line SSL_2. An insulating layer 62 may be located under or over each of the second gate conductive layers GS_2.

Each of the plurality of pillars P1 may include a surface layer Si and an inside I1. For example, the surface layer S1 of each of the pillars P1 may include a silicon material doped with an impurity, or a silicon material not doped with an impurity.

For example, the ground selection line GSL_1 and a portion of the surface layer S1 adjacent to the ground selection line GSL_1 may constitute the ground selection transistor GST (see FIG. 6). In addition, the word-lines WL1_1 through WL4_1 and a portion of the surface layer S1 adjacent to the word-lines WL1_1 through WL4_1 may constitute the memory cell transistors MC1~MC8 (see FIG. 6). In addition, the string selection line SSL_1 and a portion of the surface layer S1 adjacent to the string selection line SSL_1 may constitute the string selection transistor SST (see FIG. 6).

A drain region DR1 may be formed on the pillar P1. A drain region DR2 may be formed on the pillar P2. For example, the drain region DR1 may include a silicon material doped with an impurity. An etch-stop film 53 may be formed on a side wall of the drain region DR1. An etch-stop film 63 may be formed on a side wall of the drain region DR2.

The first vertical structure VS1 may include an edge region EG1. The second vertical structure VS2 may include an edge region EG2. As shown in FIG. 20D, a cross-section of the edge region EG1 may form a stepped pad structure. The stepped pad structure may be referred to as a "word-line pad". The plurality of first edge contacts EC1 may be connected to the edge region EG1, and an electrical signal may be applied from a peripheral circuit such as the second address decoder 603 through the first edge contacts EC1. For example, a contact plug MCP1 that passes through the first vertical structure VS_1, the first upper substrate U_SUB_1, and a part of the second semiconductor layer L2 may have one side connected to the first lower conductive line PM1 and the other side electrically connected to the edge region EG1 through the first upper conductive lines UPM1.

At least some of the first edge contacts EC1 may pass through parts of the first and second semiconductor layers L1 and L2 in the third direction between the first and second upper substrates U_SUB_1 and U_SUB_2 and may have one side electrically connected to a contact plug connected to the lower conductive line (e.g., PM1).

Figure 20E:
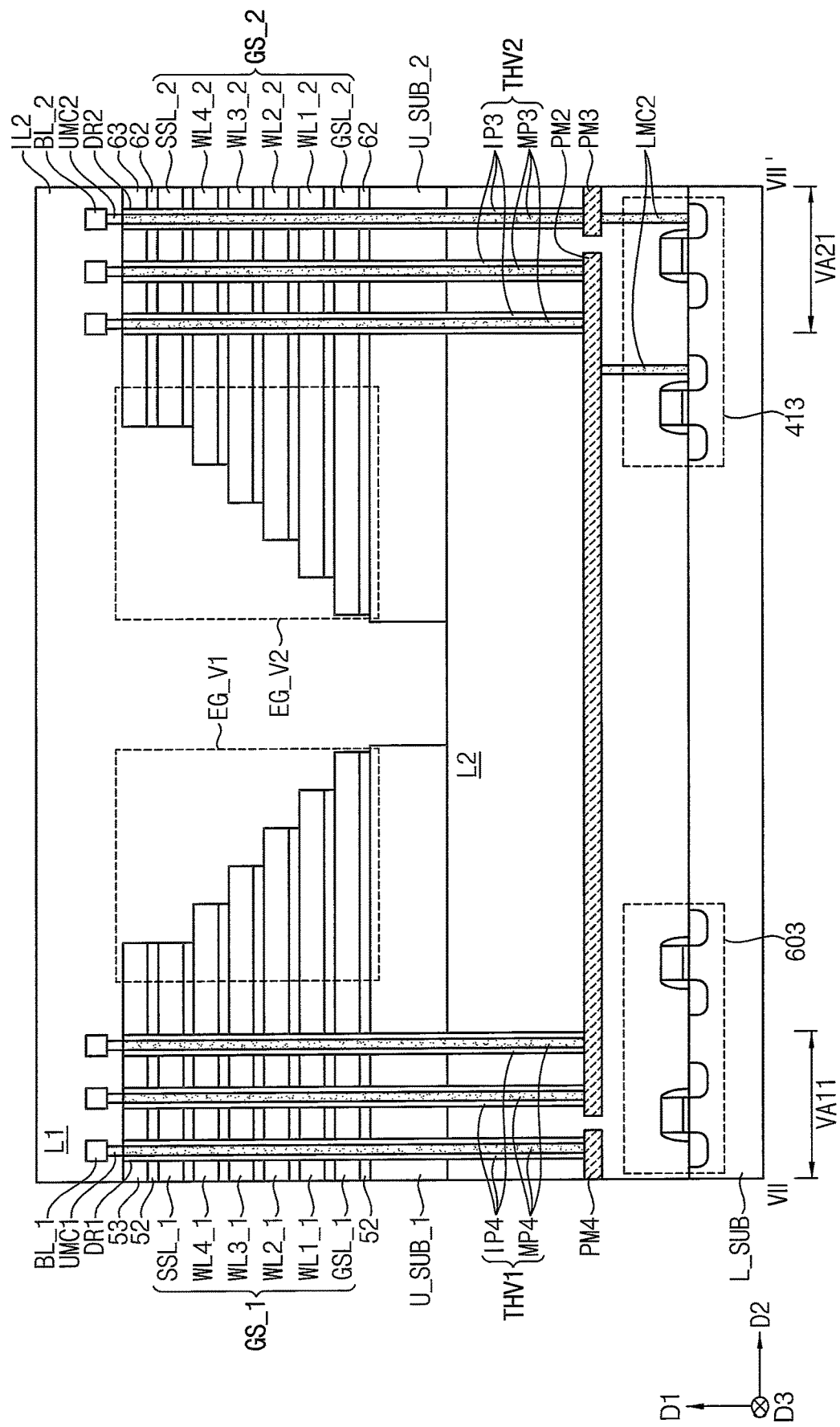
FIG. 20E is a cross-sectional view taken along line VII-VII' of FIG. 20C, illustrating configurations of the first and second semiconductor layers.

FIG. 20E is a cross-sectional view taken along line VII-VII' of FIG. 20C, illustrating configurations of the first and second semiconductor layers. For example, FIG. 20E may be a cross-sectional view illustrating the second semiconductor layer L2 overlapping the first partial block SB_1 and the via areas VA11 and VA21 provided in the first semiconductor layer L1. A repeated explanation of the same elements in FIG. 20D may not be given in FIG. 20C.

Referring to FIG. 20E, a plurality of through-hole vias THV1 passing through the first vertical structure VS1, the first upper substrate U_SUB_1, and a part of the second semiconductor layer L2 may be formed in the first via region VA11. Each of the through-hole vias THV1 may include an insulating film pattern IP4 and a conductive pattern MP4.

As shown in FIG. 20E, each of the through-hole vias THV may electrically connect the second page buffer 413 and the second upper contact UMC2. A plurality of through-hole vias THV2 passing through the second vertical structure VS2, the second upper substrate U_SUB_2, and a part of the second semiconductor layer L2 may be formed in the second via region VA21. Each of the through-hole vias THV2 may include an insulating film pattern IP3 and a conductive pattern MP3.

As shown in FIG. 20E, each of the through-hole vias THV2 may electrically connect the second page buffer circuit 413 and the second upper contact UMC2 and each of the through-hole vias THV2 may electrically connect the second page buffer circuit 413 and the first upper contact DMC1. The first upper contact DMC1 may be connected to the first bit-line BL1 The second upper contact UMC2 may be connected to the second bit-line BL2.

In other words, the first bit-lines BL1 may be electrically connected to the second page buffer circuit 413 formed on the second semiconductor layer L2 through the plurality of through-hole vias THV1 formed in the first via area VA11 and the second bit-lines BL2 may be electrically connected to the second page buffer circuit 413 formed on the second semiconductor layer L2 through the plurality of through-hole vias THV2 formed in the second via area VA21. In example embodiments, conductive patterns such as contacts may not be formed in the edge region EG_V1 of the first via area VA11 and in the edge region EG_V2 of the second via area VA21.

Figure 21:
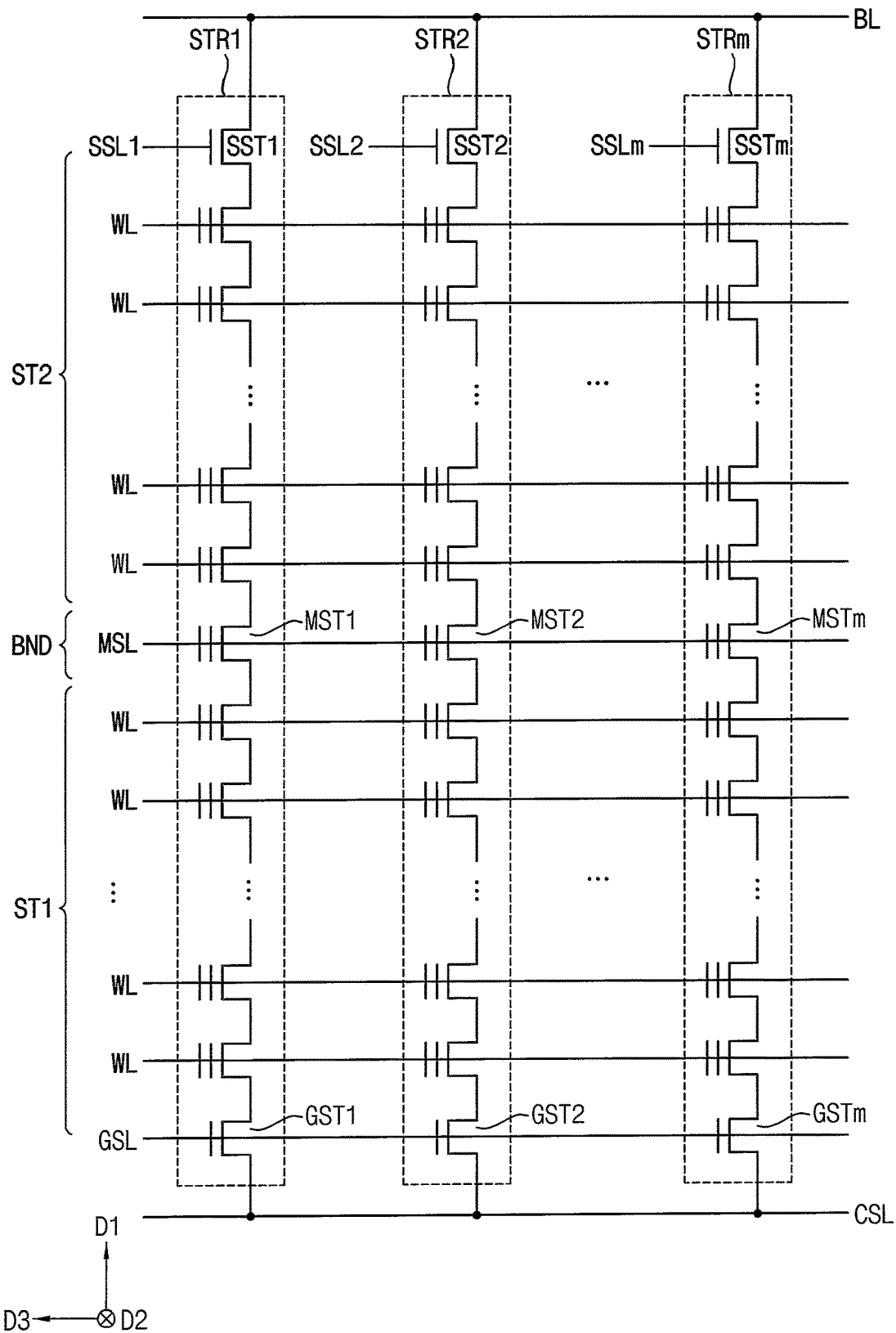
FIG. 21 is a circuit diagram illustrating a structure of a memory cell array according to example embodiments.
Figure 22:
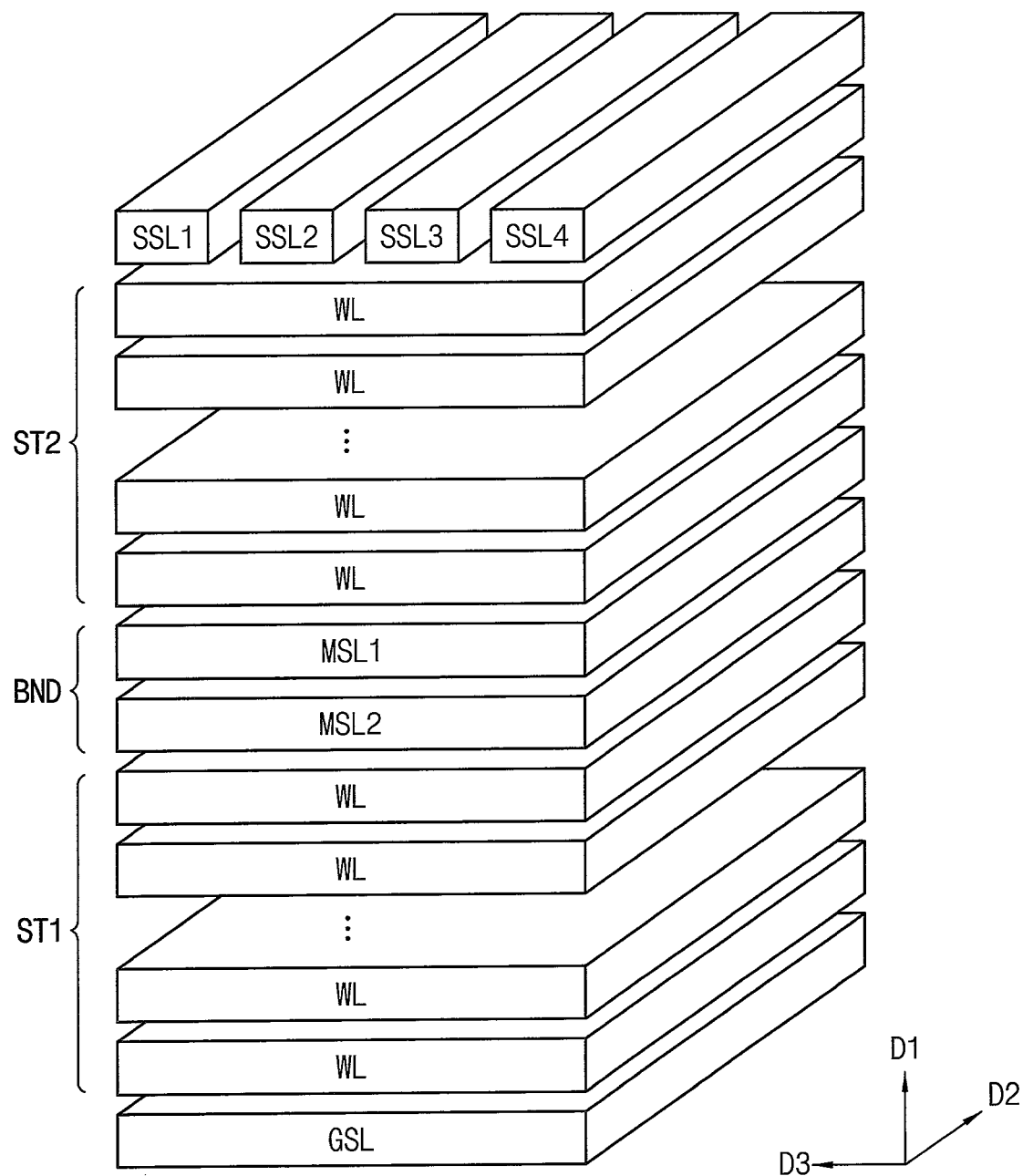
FIG. 22 is a perspective view illustrating a memory block corresponding to a structure of FIG. 21.

FIG. 21 is a circuit diagram illustrating a structure of a memory cell array according to example embodiments, and FIG. 22 is a perspective view illustrating a memory block corresponding to a structure of FIG. 21.

FIG. 21 illustrates two-dimensional version of a memory block including cell strings connected to one bit-line BL and one source line CSL for convenience of illustration, but it will be understood that the memory block may have a three-dimensional structure of a plurality of bit-lines as described with reference to FIGS. 7 and 8.

Referring to FIGS. 21 and 22, a memory block may include a plurality of cell strings STR1~STRm connected between a bit-line BL and a source line CSL. The cell strings STR1~STRm may include string selection transistors SST1~SSTm controlled by string selection lines SSL1~SSLm, memory cells controlled by word-lines WL, intermediate switching transistors MST1~MSTm controlled by an intermediate switching line MSL and a ground selection transistors GST1~GSTm controlled by a ground selection line GSL, respectively. Here, m is a natural number greater than 1. The memory cells connected to word-lines disposed in edge portions of the stacks ST1 and ST2 may be dummy cells.

FIG. 21 illustrates an example embodiment that the ground selection transistors GST1~GSTm are connected to the same ground selection line GSL. In other example embodiments, the ground selection transistors are connected to the respective ground selection lines.

In some example embodiments, as illustrated in FIGS. 21 and 22, the boundary portion BND may include one gate line MSL that switches or activates simultaneously the intermediate switching transistors connected thereto.

For performing the leakage detection operation according to example embodiments, the control circuit 450 may turn-on the intermediate switching transistors MST1~MSTm to perform leakage detection operation on word-lines of the upper stack ST2. After the leakage detection operation on word-lines of the upper stack ST2 is completed, the control circuit 450 may turn-off the intermediate switching transistors MST1~MSTm to perform leakage detection operation on word-lines of the lower stack ST1.

Figure 23:
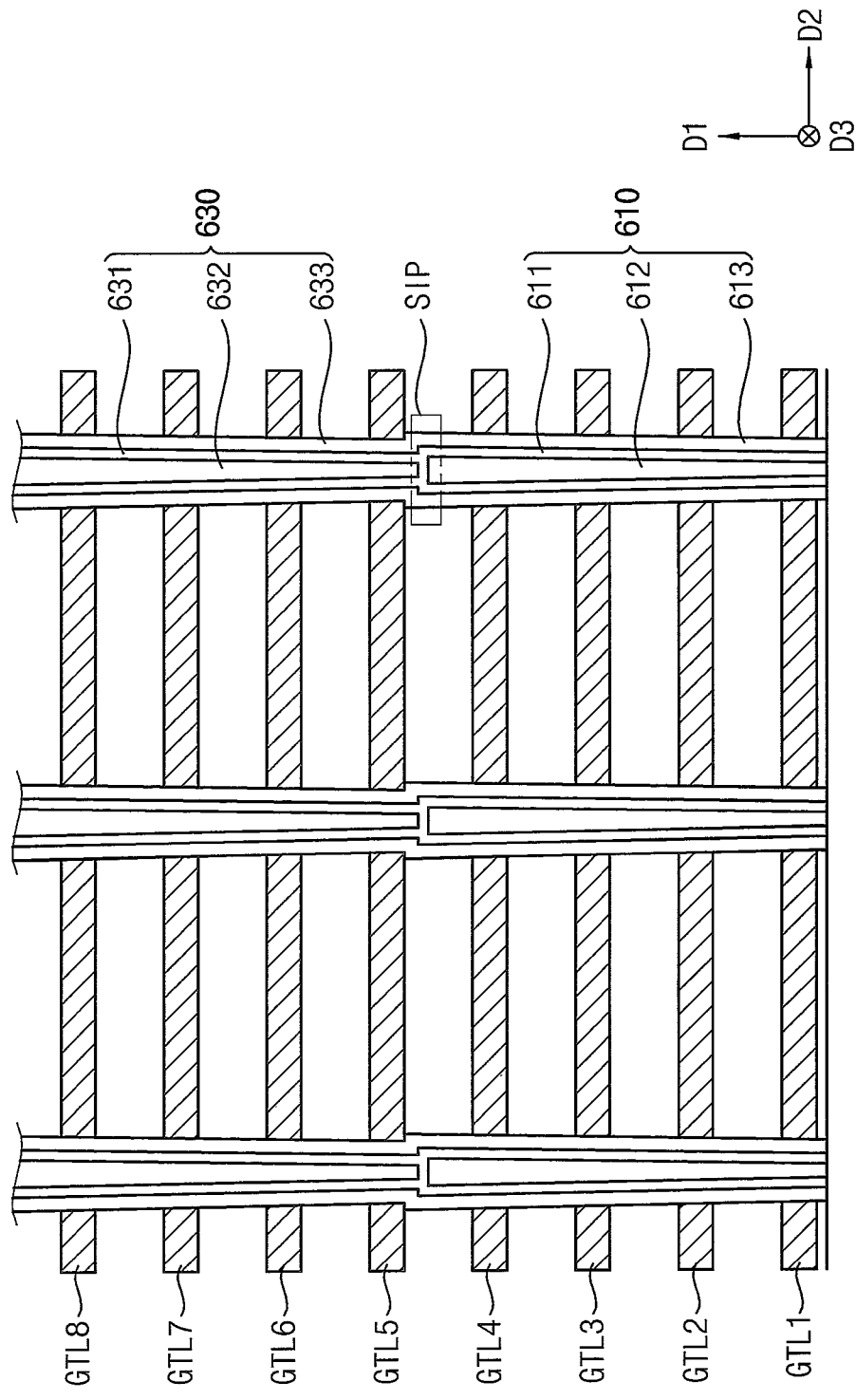
FIG. 23 is a cross-sectional view for describing an example of a boundary portion included in a memory block according to example embodiments.

FIG. 23 is a cross-sectional view for describing an example of a boundary portion included in a memory block according to example embodiments.

Referring to FIG. 23, a channel hole of each cell string STR may include a first sub channel hole 610 and a second sub channel hole 630. A channel hole may be referred to as a pillar. The first sub channel hole 610 may include a channel layer 611, an inner material 612 and an insulation layer 613. The second sub channel hole 630 may include a channel layer 631, an inner material 632 and an insulation layer 633. The channel layer 611 of the first channel hole 610 may be connected to the channel layer 631 of the second sub channel hole 630 through a P-type silicon pad SIP. The sub channel holes 610 and 630 may be formed using a stopper line GTL5 having an appropriate etch rate. For example, the stopper line GTL5 may be formed of polysilicon and the other gate lines GTL1~GTL4 and the GTL6~GTL8 may be formed of metal such as tungsten to implement the appropriate etch rate.

The above-described boundary portion BND may correspond to the stopper layer GTL5 that is used to form the plurality of sub channel holes. The cells in the stopper layer GTL5 may be improper for storing data, and the stopper layer may be used as the boundary portion BND to from the intermediate switching transistors. Example embodiments are not limited to a boundary portion of one stopper layer, and the boundary portion may include two or more gate layers.

Figure 24:
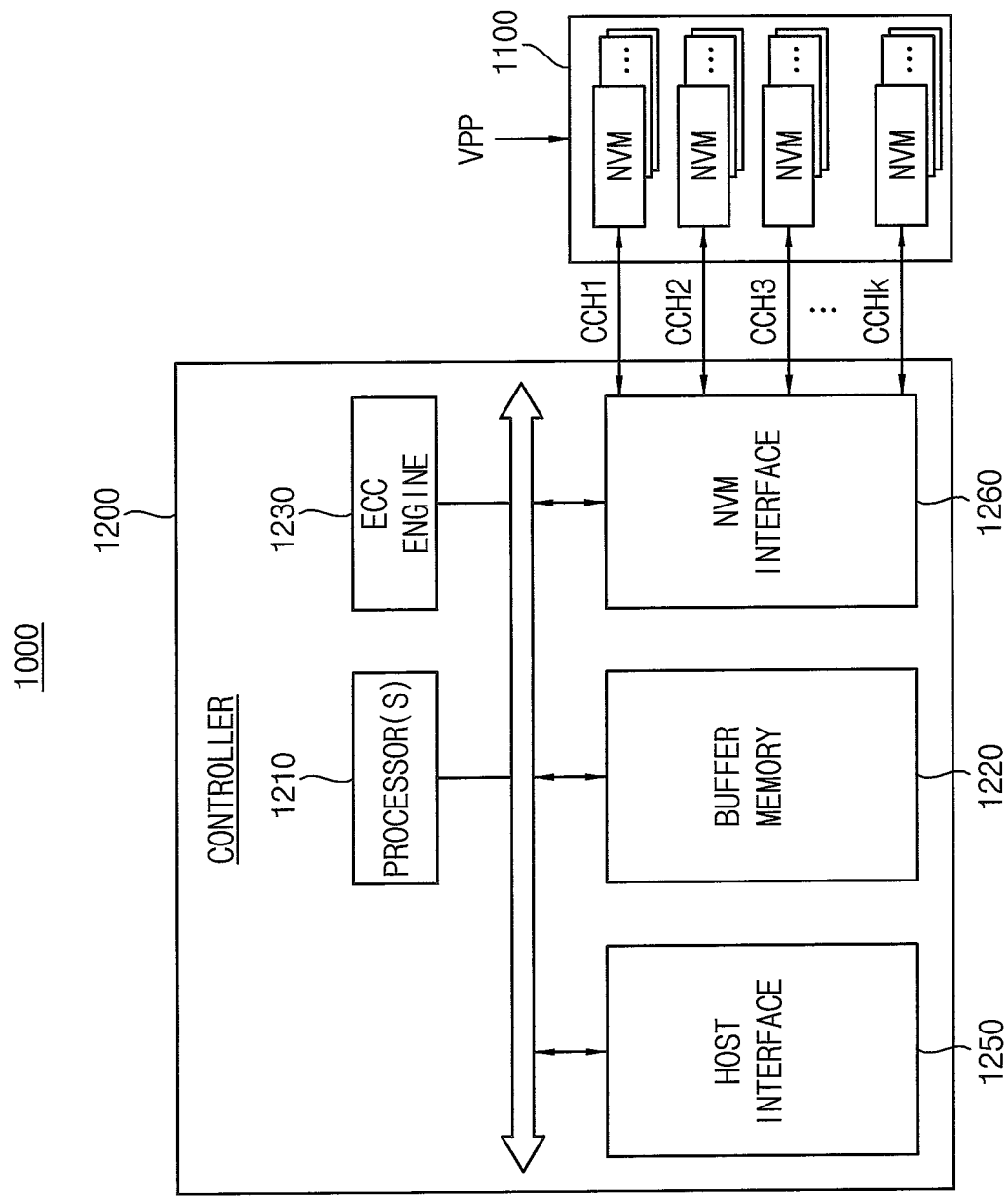
FIG. 24 is a block diagram illustrating a storage device that includes a nonvolatile memory device according to example embodiments.

FIG. 24 is a block diagram illustrating a storage device that includes a nonvolatile memory device according to example embodiments.

Referring to FIG. 24, a storage device 1000 includes a plurality of nonvolatile memory devices 1100 and a controller 1200. For example, the storage device 1000 may be any storage device such as an embedded multimedia card (eMMC), a universal flash storage (UFS), a solid state disc or solid state drive (SSD), etc.

The controller 1200 may be connected to the nonvolatile memory devices 1100 via a plurality of channels CCH1, CCH2, CCH3, . . . , CCHk. The controller 1200 may include one or more processors 1210, a buffer memory 1220, an error correction code (ECC) engine 1230, a host interface 1250 and a nonvolatile memory (NVM) interface 1260.

The buffer memory 1220 may store data used to drive the controller 1200. The ECC circuit 1230 may calculate error correction code values of data to be programmed during a program operation, and may correct an error of read data using an error correction code value during a read operation. In a data recovery operation, the ECC engine 1230 may correct an error of data recovered from the nonvolatile memory devices 1100. The host interface 1250 may provide an interface with an external device. The nonvolatile memory interface 1260 may provide an interface with the nonvolatile memory devices 1100.

Each of the nonvolatile memory devices 1100 may correspond to the nonvolatile memory device according to example embodiments, and may be optionally supplied with an external high voltage VPP.

Figure 25:
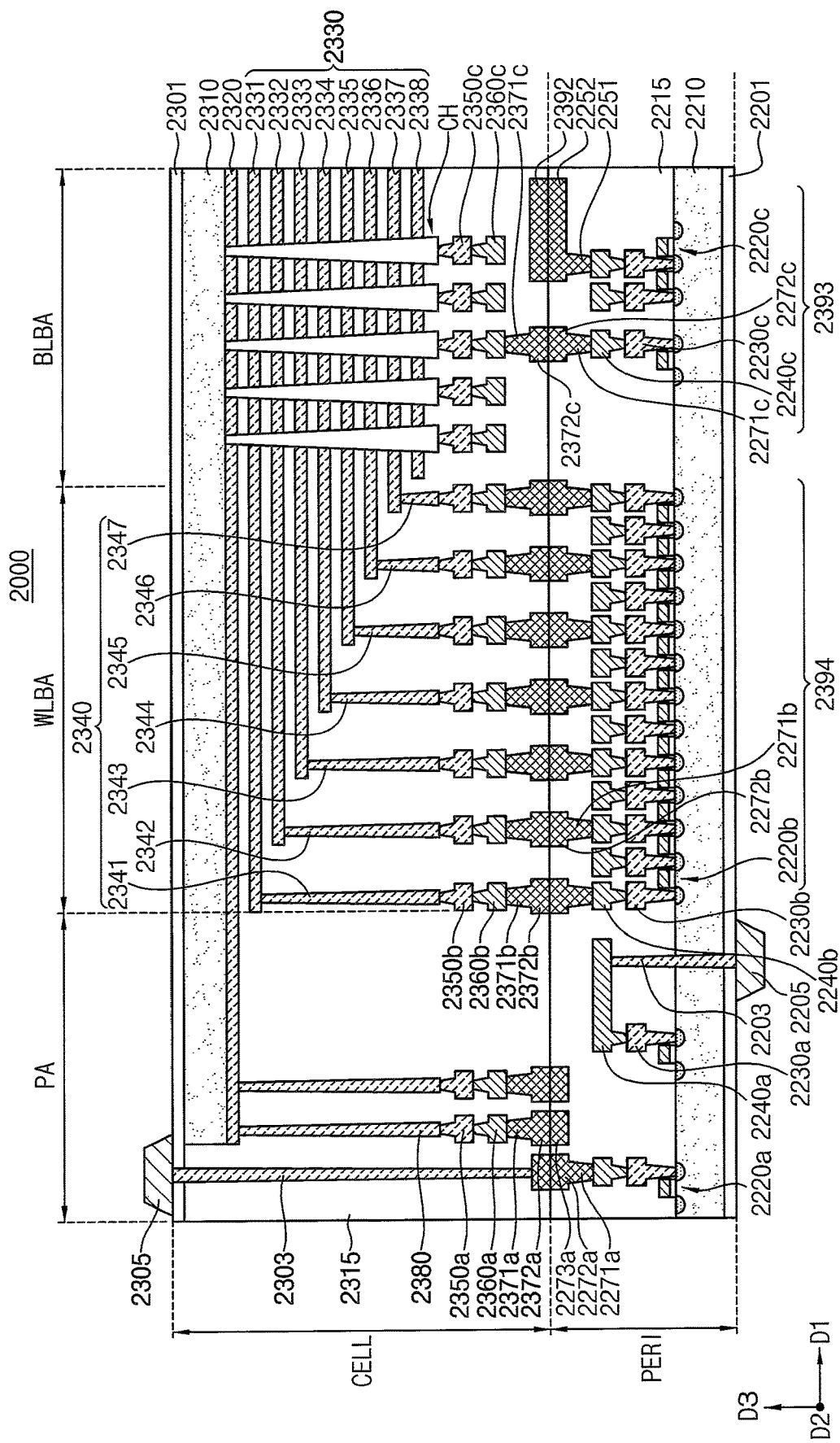
FIG. 25 is a cross-sectional view of a nonvolatile memory device according to example embodiments.

FIG. 25 is a cross-sectional view of a nonvolatile memory device according to example embodiments.

Referring to FIG. 25, a nonvolatile memory device or a memory device 2000 may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. Example embodiments, however, are not limited thereto. For example, the bonding metals may also be formed of aluminum (Al) or tungsten (W).

Each of the peripheral circuit region PERI and the cell region CELL of the memory device 2000 may include an external pad bonding area PA, a word-line bonding area WLBA, and a bit-line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having relatively high electrical resistivity, and the second metal layers 2240a, 2240b, and 2240c may be formed of copper having relatively low electrical resistivity.

In an example embodiment illustrate in FIG. 25, although only the first metal layers 2230a, 2230b, and 2230c and the second metal layers 2240a, 2240b, and 2240c are shown and described, example embodiments are not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word-line bonding area WLBA. In the word-line bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, or the like. Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of word-lines 2331, 2332, 2333, 2334, 2335, 2336, 2337, and 2338 (i.e., 2330) may be stacked in a third direction D3 (e.g., a Z-axis direction), perpendicular to an upper surface of the second substrate 2310. At least one string selection line and at least one ground selection line may be arranged on and below the plurality of word-lines 2330, respectively, and the plurality of word-lines 2330 may be disposed between the at least one string selection line and the at least one ground selection line.

In the bit-line bonding area BLBA, a channel structure CH may extend in the third direction D3 (e.g., the Z-axis direction), perpendicular to the upper surface of the second substrate 2310, and pass through the plurality of word-lines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit-line contact, and the second metal layer 2360c may be a bit-line. In an example embodiment, the bit-line 2360c may extend in a second direction D2 (e.g., a Y-axis direction), parallel to the upper surface of the second substrate 2310.

As illustrated in FIG. 23, an area in which the channel structure CH, the bit-line 2360c, and the like are disposed may be defined as the bit-line bonding area BLBA. In the bit-line bonding area BLBA, the bit-line 2360c may be electrically connected to the circuit elements 2220c providing a page buffer 2393 in the peripheral circuit region PEM. The bit-line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word-line bonding area WLBA, the plurality of word-lines 2330 may extend in a first direction D1 (e.g., an X-axis direction), parallel to the upper surface of the second substrate 2310 and perpendicular to the second direction D2, and may be connected to a plurality of cell contact plugs 2341, 2342, 2343, 2344, 2345, 2346, and 2347 (i.e., 2340). The plurality of word-lines 2330 and the plurality of cell contact plugs 2340 may be connected to each other in pads provided by at least a portion of the plurality of word-lines 2330 extending in different lengths in the first direction D1. A first metal layer 2350b and a second metal layer 2360b may be connected to an upper portion of the plurality of cell contact plugs 2340 connected to the plurality of word-lines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the word-line bonding area WLBA.

The plurality of cell contact plugs 2340 may be electrically connected to the circuit elements 2220b forming a row decoder 2394 in the peripheral circuit region PERI. In an example embodiment, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating film 2301. The second input/output pad 2305 may be connected to at least one of the plurality of circuit elements 2220a, 2220b, and 2220c disposed in the peripheral circuit region PERI through a second input/output contact plug 2303. In the example embodiment, the second input/output pad 2305 is electrically connected to a circuit element 2220a.

According to example embodiments, the second substrate 2310 and the common source line 2320 may not be disposed in an area in which the second input/output contact plug 2303 is disposed. Also, the second input/output pad 2305 may not overlap the word-lines 2330 in the third direction D3 (e.g., the Z-axis direction). The second input/output contact plug 2303 may be separated from the second substrate 2310 in the direction, parallel to the upper surface of the second substrate 2310, and may pass through the interlayer insulating layer 2315 of the cell region CELL to be connected to the second input/output pad 2305.

According to example embodiments, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. Alternatively, the memory device 2000 may include both the first input/output pad 2205 and the second input/output pad 2305.

A metal pattern provided on an uppermost metal layer may be provided as a dummy pattern or the uppermost metal layer may be absent, in each of the external pad bonding area PA and the bit-line bonding area BLBA, respectively included in the cell region CELL and the peripheral circuit region PERI.

In the external pad bonding area PA, the memory device 2000 may include a lower metal pattern 2273a, corresponding to an upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL.

The lower bonding metals 2271b and 2272b may be formed on the second metal layer 2240b in the word-line bonding area WLBA. In the word-line bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bit-line bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

The above-mentioned first through fifth voltages may be applied to at least one memory block in the cell region CELL through the lower bonding metals 2271*b* and 2272*b* in the peripheral circuit region PERI and upper bonding metals 2371*b* and 2372*b* of the cell region CELL. The control circuit may perform the leakage detection operation by while applying a first voltage to a block word-line coupled to each gate of a plurality of pass transistors which connect a string selection line, a plurality of word-lines and a ground selection line to respective one of a plurality of driving lines, applying a second voltage to the plurality of driving lines, commonly coupled to a sensing node, to set-up the plurality of word-lines with a third voltage during a word-line set-up period, where the string selection line is coupled to the string selection transistor, the plurality of word-lines are coupled to the memory cells and the ground selection line is coupled to the ground selection transistor; while precharging plurality of driving lines with the second voltage, developing target word-lines from among the plurality of word-lines by applying a fourth voltage to the block word-line to turn-off the plurality of pass transistors, during a word-line development period; and detecting leakage of at least a portion of the target word-lines by applying a fifth voltage smaller than the first voltage to the block word-line and by detecting a voltage drop of the sensing node.

A nonvolatile memory device or a storage device according to example embodiments may be packaged using various package types or package configurations.

At least one of the buffers, control circuits, controllers, decoders, drivers, engines, generators, I/O circuits, interfaces, leakage detectors, processors, or other element represented by a block as illustrated in FIGS. 5, 6, 11-17 and 24 may be embodied as various numbers of hardware, software and/or firmware structures that execute respective functions described above, according to example embodiments. For example, at least one of the buffers, control circuits, controllers, decoders, drivers, engines, generators, I/O circuits, interfaces, leakage detectors, processors, or other element may use a direct circuit structure, such as a memory, a processor, a logic circuit, a look-up table, etc. that may execute the respective functions through controls of one or more microprocessors or other control apparatuses. Also, at least one of the buffers, control circuits, controllers, decoders, drivers, engines, generators, I/O circuits, interfaces, leakage detectors, processors, or other element may be specifically embodied by a module, a program, or a part of code, which contains one or more executable instructions for performing specified logic functions, and executed by one or more microprocessors or other control apparatuses. Also, at least one of the buffers, control circuits, controllers, decoders, drivers, engines, generators, I/O circuits, interfaces, leakage detectors, processors, or other element may further include or may be implemented by a processor such as a central processing unit (CPU) that performs the respective functions, a microprocessor, or the like. Two or more of the buffers, control circuits, controllers, decoders, drivers, engines, generators, I/O circuits, interfaces, leakage detectors, processors, or other element may be combined into one single component, element, module or unit which performs all operations or functions of the combined two or more of buffers, control circuits, controllers, decoders, drivers, engines, generators, I/O circuits, interfaces, leakage detectors, processors, or other element. Also, at least part of functions of at least one of the buffers, control circuits, controllers, decoders, drivers, engines, generators, I/O circuits, interfaces, leakage detectors, processors, or other element may be performed by another of these components. Further, although a bus is not illustrated in each of the above block diagrams, communication between the components may be performed through the bus. Functional aspects of the above example embodiments may be implemented in algorithms that execute on one or more processors. Furthermore, the buffers, control circuits, controllers, decoders, drivers, engines, generators, I/O circuits, interfaces, leakage detectors, processors, or other element represented by a block or processing steps may employ any number of related art techniques for electronics configuration, signal processing and/or control, data processing and the like.

The inventive concept may be applied to various devices and systems that include the nonvolatile memory devices. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A method of operating a nonvolatile memory device which comprises at least one memory block comprising a plurality of cell strings, each of which comprises a string selection transistor, a plurality of memory cells and a ground selection transistor which are connected in series and arranged in a vertical direction between a bit-line and a source line, the method comprising:

during a set-up period and while applying a first voltage to a block word-line that is coupled to each gate of a first pass transistor, a plurality of second pass transistors and a third pass transistor which respectively connect a string selection line, a plurality of word-lines and a ground selection line to a plurality of driving lines, applying a second voltage to the plurality of driving lines, commonly coupled to a sensing node, to provide the string selection line, the plurality of word-lines and the ground selection line with a third voltage, the string selection line being coupled to the string selection transistor, the plurality of word-lines being coupled to the plurality of memory cells and the ground selection line being coupled to the ground selection transistor;

during a development period and while precharging the plurality of driving lines with the second voltage, applying a fourth voltage to the block word-line to turn-off the first pass transistor, the plurality of second pass transistors and the third pass transistor to develop at least one target line from among the string selection line, the plurality of word-lines and the ground selection line; and during a sensing period, applying a fifth voltage smaller than the first voltage to the block word-line, detecting a voltage drop of the sensing node, and detecting leakage of the at least one target line based on the voltage drop.

2. The method of claim 1, wherein the plurality of driving lines are coupled to the sensing node by a plurality of selection transistors, and wherein the at least one target line corresponds to each of the plurality of word-lines selected by enabling a portion of selection transistors coupled to the plurality of second pass transistors, from among the plurality of selection transistors in an all word-line leakage detection mode.

3. The method of claim 2, wherein during the set-up period:

a level of the second voltage is greater than a level of the first voltage, and a level of the third voltage is smaller than the level of the first voltage by a first threshold voltage, wherein during the sensing period:

a level of the fifth voltage is greater than a level of the at least one target line by the first threshold voltage, and the method further comprises determining the leakage has occurred in a word-line coupled to at least one pass transistor that is turned-on by the fifth voltage from among the plurality of second pass transistors.

4. The method of claim 1, wherein the plurality of driving lines are coupled to the sensing node by a plurality of selection transistors, and wherein the at least one target line corresponds to even word-lines among the plurality of word-lines selected by enabling a portion of selection transistors coupled to a portion of the plurality of second pass transistors, from among the plurality of selection transistors in an even word-line leakage detection mode.

5. The method of claim 4, wherein during the set-up period:

a level of the second voltage is greater than a level of the first voltage, and a level of the third voltage is smaller than the level of the first voltage by a first threshold voltage, wherein during the sensing period:

a level of the fifth voltage is greater than a level of the at least one target line by the first threshold voltage, and the method further comprises determining the leakage has occurred in one of the even word-lines, coupled to at least one pass transistor that is turned-on by the fifth voltage from among the portion of the plurality of second pass transistors.

6. The method of claim 1, wherein the plurality of driving lines are coupled to the sensing node by a plurality of selection switches, and wherein the at least one target line corresponds to odd word-lines among the plurality of word-lines selected by enabling a portion of selection transistors coupled to a portion of the plurality of second pass transistors, from among the plurality of selection switches in an odd word-line leakage detection mode.

7. The method of claim 4, wherein during the set-up period:

a level of the second voltage is greater than a level of the first voltage, and a level of the third voltage is smaller than the level of the first voltage by a first threshold voltage, wherein during the sensing period:

a level of the fifth voltage is greater than a level of the at least one target line by the first threshold voltage, and the method further comprises determining the leakage has occurred in one of odd word-lines, coupled to at least one pass transistor that is turned-on by the fifth voltage from among the portion of the plurality of second pass transistors.

8. The method of claim 1, wherein the plurality of driving lines are coupled to the sensing node by a plurality of selection transistors, and wherein the at least one target line corresponds to the string selection line, at least one dummy word-line and the ground selection line by enabling a portion of selection transistors coupled to the first pass transistor, at least one of the plurality of second pass transistors and the third pass transistor, from among the plurality of selection transistors in a selection/dummy line leakage detection mode.

9. The method of claim 8, wherein during the set-up period:

a level of the second voltage is greater than a level of the first voltage, and a level of the third voltage is smaller than the level of the first voltage by a first threshold voltage, wherein during the sensing period:

a level of the fifth voltage is greater than a level of the at least one target line by the first threshold voltage, and the method further comprises determining the leakage has occurred in one of the string selection line, the at least one dummy word-line and the ground selection line coupled to at least one pass transistor that is turned-on by the fifth voltage from among the first pass transistor, the at least one of the plurality of second pass transistors and the third pass transistor.

10. The method of claim 1, wherein:

the first voltage is applied to the block word-line through a first path; and the voltage drop of the sensing node is detected through a second path different from the first path.

11. The method of claim 1, wherein:

the sensing period precedes a program operation of a program loop on the at least one memory block, and the method further comprises ending the program loop based on it being determined that the leakage occurs in at least one of the plurality of word-lines.

12. The method of claim 1, wherein during the set-up period:

a level of the first voltage is greater than a level of the second voltage, and a level of the third voltage is substantially equal to the level of the first voltage.

13. The method of claim 1, further comprising performing an erase operation on the at least one memory block, wherein the detecting the leakage of the at least one target line is performed after the erase operation.

14. A nonvolatile memory device comprising:
at least one memory block comprising a plurality of cell strings where each of the plurality of cell strings, each of which comprises a string selection transistor, a plurality of memory cells and a ground selection transistor which are connected in series and arranged in a vertical direction between a bit-line and a source line; and
a control circuit configured to control a leakage detection operation by:
during a set-up period and while applying a first voltage to a block word-line that is coupled to each gate of a first pass transistor, a plurality of second pass transistors and a third pass transistor which respectively connect a string selection line, a plurality of word-lines and a ground selection line to a plurality of driving lines, applying a second voltage to the plurality of driving lines, commonly coupled to a sensing node, to provide the string selection line, the plurality of word-lines and the ground selection line with a third voltage, the string selection line being coupled to the string selection transistor, the plurality of word-lines being coupled to the plurality of memory cells and the ground selection line being coupled to the ground selection transistor;
during a development period and while precharging the plurality of driving lines with the second voltage, applying a fourth voltage to the block word-line to turn-off the first pass transistor, the plurality of second pass transistors and the third pass transistor to develop at least one target line from among the string selection line, the plurality of word-lines and the ground selection line; and
during a sensing period, applying a fifth voltage smaller than the first voltage to the block word-line, detecting a voltage drop of the sensing node, and detecting leakage of the at least one target line based on the voltage drop.

15. The nonvolatile memory device of claim 14, further comprising:
a voltage generator configured to generate word-line voltages based on a control signal;
an address decoder configured to provide the word-line voltages to the at least one memory block; and
a leakage detector coupled to the sensing node,
wherein the address decoder comprises:
a pass switch circuit comprising a plurality of pass switch transistors;
a first voltage transfer circuit;
a second voltage transfer circuit connected to the voltage generator and the first voltage transfer circuit at the sensing node; and
a selection switch circuit connected between the first voltage transfer circuit and the plurality of driving lines, the selection switch circuit comprising a plurality of selection transistors configured to connect the first voltage transfer circuit to the plurality of driving lines.

16. The nonvolatile memory device of claim 15, wherein the at least one target line corresponds to each of the plurality of word-lines selected by enabling a portion of selection transistors coupled to the plurality of second pass transistors, from among the plurality of selection transistors in an all word-line leakage detection mode,
wherein the control circuit is configured to control the voltage generator and the address decoder such that:
a level of the second voltage is greater than a level of the first voltage, and a level of the third voltage is smaller than the level of the first voltage by a first threshold voltage during the set-up period; and
a level of the fifth voltage is greater than a level of each of the at least one target line by the first threshold voltage during the sensing period, and
wherein the leakage detector is configured to determine that leakage occurs in a word-line coupled to at least one pass transistor that is turned-on by the fifth voltage from among the plurality of second pass transistors during the sensing period.

17. The nonvolatile memory device of claim 15, wherein the at least one target line corresponds to even word-lines or odd word-lines among the plurality of word-lines selected by enabling a portion of selection transistors coupled to a portion of the plurality of second pass transistors, from among the plurality of selection transistors in an even/odd word-line leakage detection mode, and
wherein the control circuit is configured to control the voltage generator and the address decoder such that:
a level of the first voltage is greater than a level of the second voltage, and a level of the third voltage is about the level of the first voltage during the set-up period; and
a level of the fifth voltage is greater than a level of each of the at least one target line by a first threshold voltage during the sensing period, and
wherein the leakage detector is configured to determine that leakage occurs in one of the even word-lines or the odd word-lines, coupled to at least one pass transistor that is turned-on by the fifth voltage from among the portion of the plurality of second pass transistors during the sensing period.

18. The nonvolatile memory device of claim 15, wherein the at least one target line corresponds to the string selection line, at least one dummy word-line and the ground selection line by enabling a portion of selection transistors coupled to the first pass transistor, at least one of the plurality of second pass transistors and the third pass transistor, from among the plurality of selection transistors in a selection/dummy line leakage detection mode, and
wherein the leakage detector is configured to determine that leakage occurs in one of the string selection line, the at least one dummy word-line and the ground selection line coupled to at least one pass transistor that is turned-on by the fifth voltage from among the first pass transistor, the at least one of the plurality of second pass transistors and the third pass transistor during the sensing period.

19. The nonvolatile memory device of claim 14, wherein the control circuit is configured to apply the first voltage to the block word-line through a first path during the set-up period, and
wherein the nonvolatile memory device further comprises a leakage detector configured to detect the voltage drop of the sensing node through a second path different from the first path during the sensing period.

20. The nonvolatile memory device of claim 14, wherein the plurality of cell strings are divided into a plurality of stacks arranged in the vertical direction,
wherein the at least one memory block further comprises a plurality of intermediate switching transistors disposed in a boundary portion between two adjacent stacks in the vertical direction, the plurality of intermediate switching transistors being configured to perform a switching operation to control electrical connection of the plurality of cell strings, respectively, and
wherein the control circuit is configured to control the leakage detection operation by controlling the switching operation of the plurality of intermediate switching transistors.

* * * * *